(12) United States Patent
Fujikawa

(10) Patent No.: US 11,398,509 B2
(45) Date of Patent: Jul. 26, 2022

(54) ELECTRO-OPTICAL DEVICE AND ELECTRONIC APPARATUS

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 230 days.

(21) Appl. No.: 16/894,403

(22) Filed: Jun. 5, 2020

(65) Prior Publication Data
US 2020/0388639 A1 Dec. 10, 2020

(30) Foreign Application Priority Data
Jun. 5, 2019 (JP) .............................. JP2019-105067

(51) Int. Cl.
| | |
|---|---|
| *H01L 27/12* | (2006.01) |
| *G02F 1/1368* | (2006.01) |
| *G09G 3/36* | (2006.01) |
| *G02F 1/1362* | (2006.01) |

(52) U.S. Cl.
CPC ........ *H01L 27/1255* (2013.01); *G02F 1/1368* (2013.01); *G02F 1/136286* (2013.01); *G09G 3/3648* (2013.01); *H01L 27/124* (2013.01); *G09G 2300/0842* (2013.01); *G09G 2300/0871* (2013.01)

(58) Field of Classification Search
CPC ............ G02F 1/136286; G02F 1/1368; G09G 3/2092; G09G 3/3648; G09G 2300/0426; G09G 2310/0281; H01L 27/124; H01L 27/1255

See application file for complete search history.

(56) References Cited

U.S. PATENT DOCUMENTS

| | | | |
|---|---|---|---|
| 6,346,730 B1* | 2/2002 | Kitakado | H01L 29/4908 257/E21.414 |
| 2010/0309186 A1* | 12/2010 | Minami | G09G 3/3233 345/211 |
| 2013/0039455 A1 | 2/2013 | Horiuchi et al. | |
| 2018/0149911 A1 | 5/2018 | Yamaguchi et al. | |

FOREIGN PATENT DOCUMENTS

| | | |
|---|---|---|
| JP | S60-061999 A | 4/1985 |
| JP | 2011-180524 A | 9/2011 |
| WO | 2011/135873 A1 | 11/2011 |
| WO | 2016/190187 A1 | 12/2016 |

* cited by examiner

*Primary Examiner* — Allan R Wilson
(74) *Attorney, Agent, or Firm* — Oliff PLC

(57) ABSTRACT

Provided is an electro-optical device including a plurality of pixel electrodes arranged in a display region, a first transistor that captures a pulse supplied to a source node by using a clock signal supplied to a gate node and outputs the pulse from the drain node, a second transistor to which the pulse output from the drain node is input, and a capacitance element having one end coupled to the drain node and another end held at a predetermined potential. In the capacitance element, an interlayer insulating film is sandwiched between a first peripheral electrode formed of a same layer as the plurality of pixel electrodes and a wiring formed of a predetermined electrode layer, and the wiring includes a portion overlapping the second transistor in plan view.

6 Claims, 13 Drawing Sheets

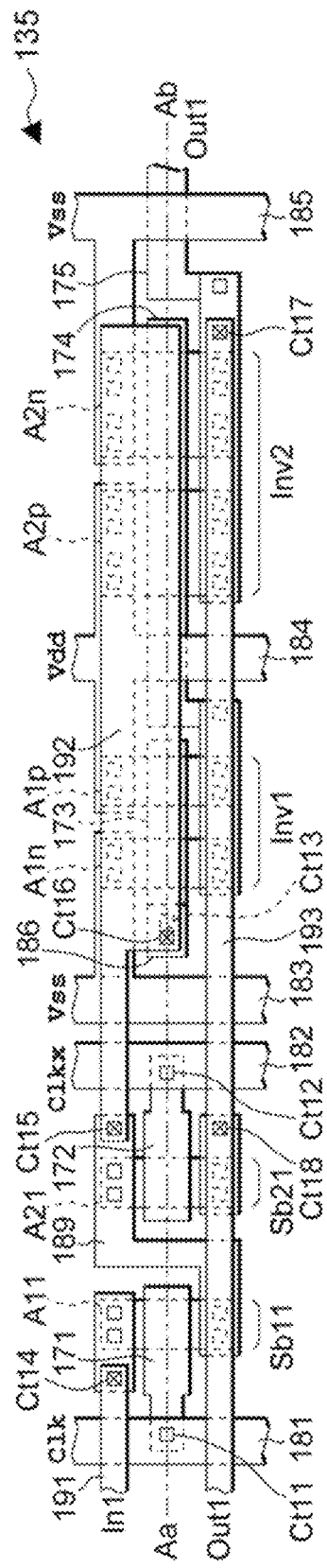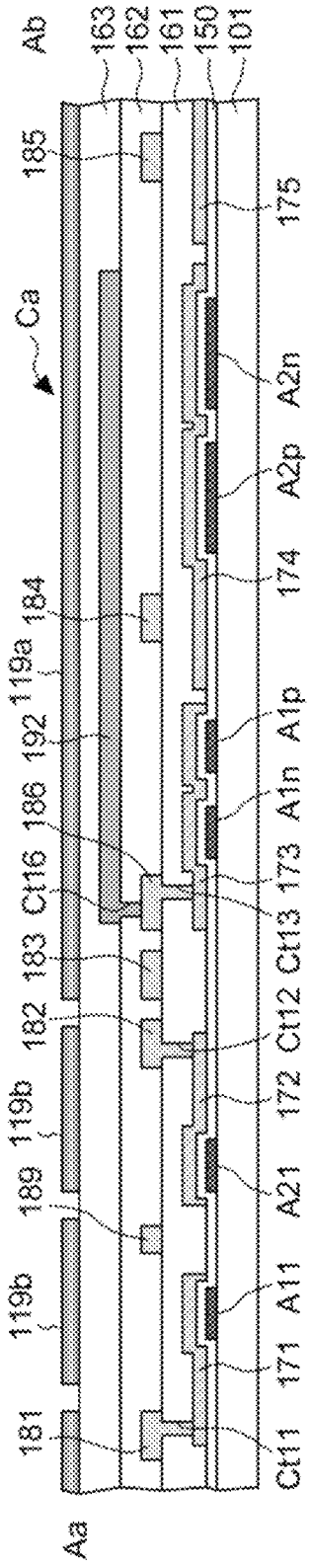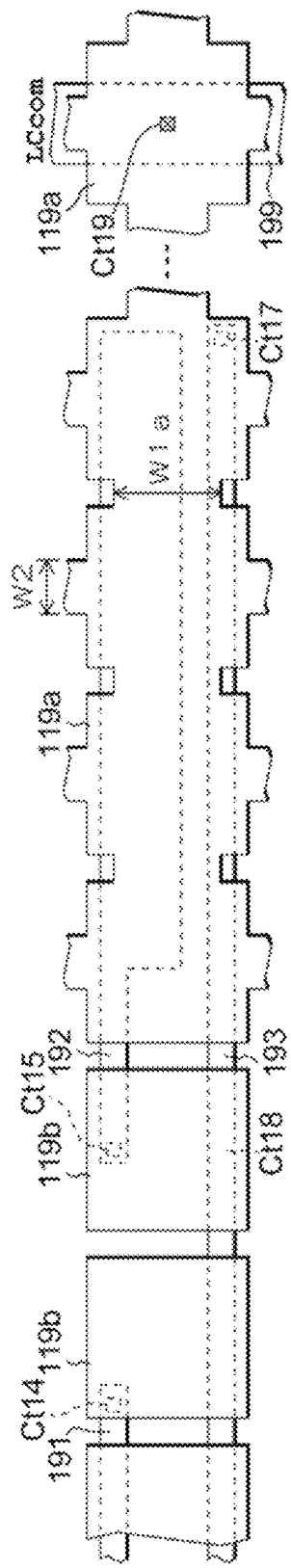
FIG. 14A
FIG. 14B
FIG. 14C

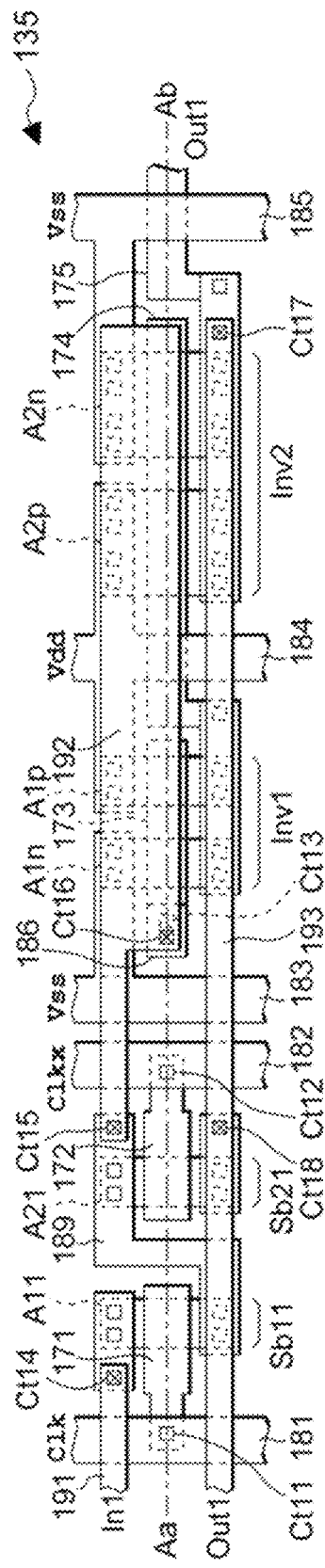
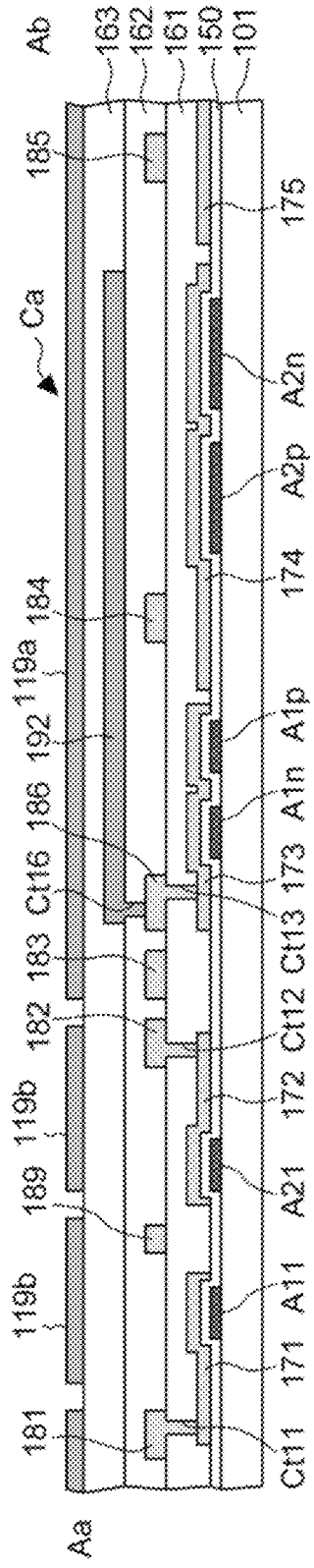
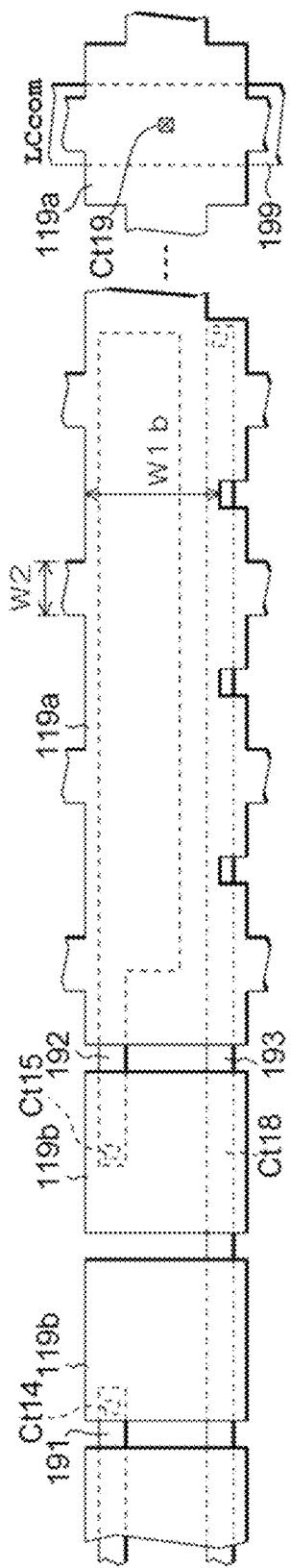
FIG. 15A
FIG. 15B
FIG. 15C

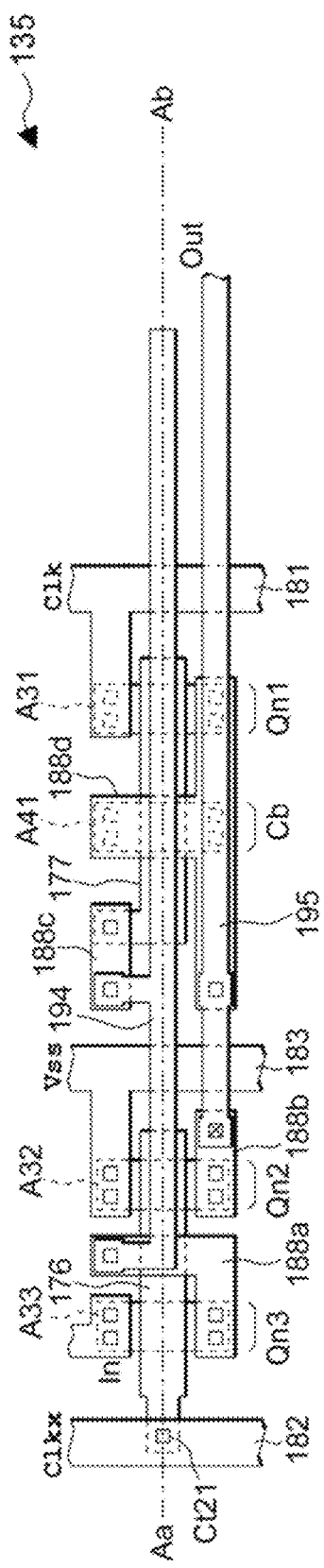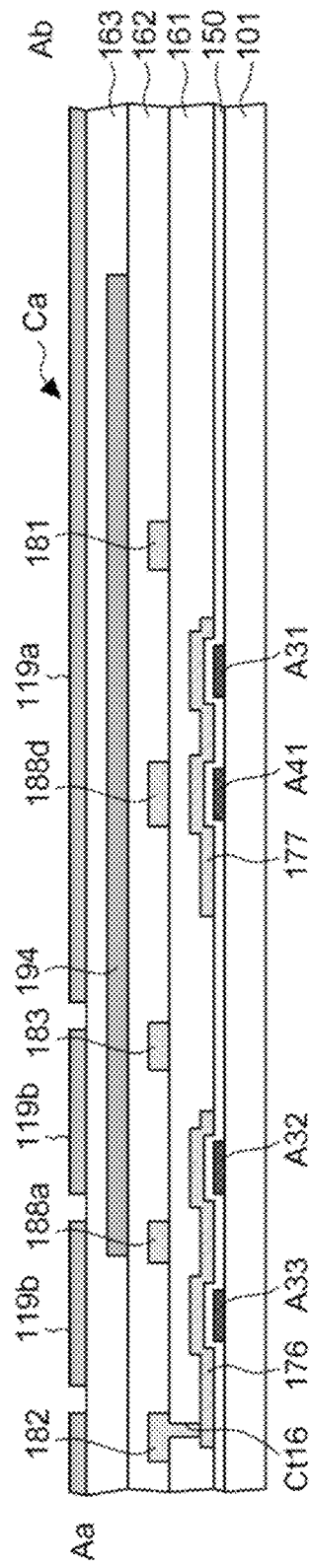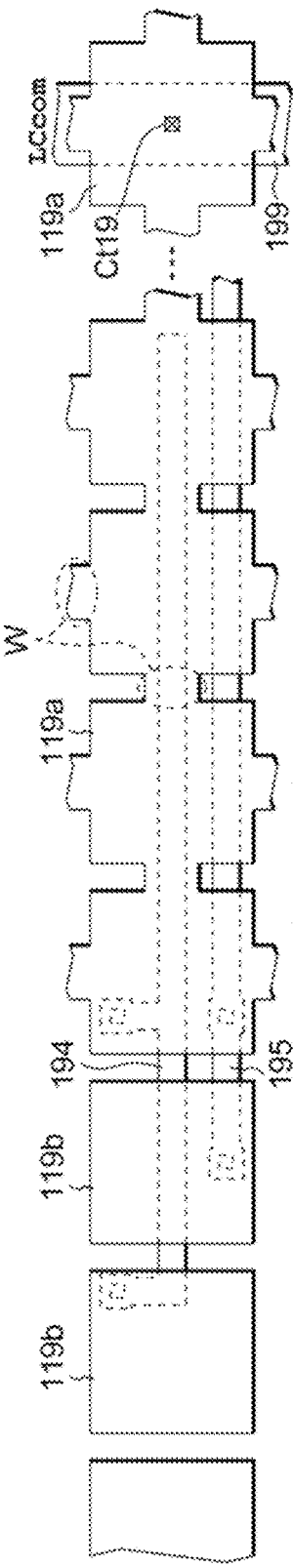
FIG. 19A
FIG. 19B
FIG. 19C

ELECTRO-OPTICAL DEVICE AND ELECTRONIC APPARATUS

The present application is based on, and claims priority from JP Application Serial Number 2019-105067, filed Jun. 5, 2019, the disclosure of which is hereby incorporated by reference herein in its entirety.

BACKGROUND

1. Technical Field

The present disclosure relates to an electro-optical device and an electronic apparatus.

2. Related Art

For example, in an electro-optical device in which a liquid crystal element is used as a display element, a drive circuit that drives a pixel circuit may be formed in the same process as a pixel circuit including the display element, a transistor, and the like. Since the pixel circuit is provided corresponding to an intersection of a scanning line and a data line, the drive circuit is largely classified into a scanning line drive circuit that drives the scanning line and a data line drive circuit that drives the data line. Of these, the scanning line drive circuit is typically configured to sequentially shift a start pulse in accordance with a clock signal, using a shift register, and supply the start pulse to the scanning line as a scanning signal.

In order to prevent erroneous operation of this type of shift register, technology is known in which the shift register is configured and a capacitance element is formed on an output side terminal of the transistor formed in the same process as the pixel circuit (see, for example, JP 60-61999 A).

Specifically, in the above-described technology, the capacitance element has a configuration in which wiring formed by a gate electrode layer of a transistor, an insulating film covering the gate electrode layer, and wiring formed by an electrode layer different from the gate electrode layer are arranged in this order.

However, as miniaturization and improved high definition of electro-optical devices progresses, as in recent years, there is a format where a configuration is employed in which a capacity area is increased by forming a trench structure for a storage capacitance structure of the pixel circuit, for example. Alternatively, a reduction in data line capacity is required for high-speed driving. In such a format, there is a problem in that the insulating film becomes thicker and it is difficult to secure sufficient capacity.

SUMMARY

In order to solve the above-described problem, an electro-optical device according to an aspect of the present disclosure includes a plurality of pixel electrodes arranged in a display area, and a drive circuit provided in a peripheral region outside the display area.

The drive circuit includes a first transistor configured to output from a drain node a pulse supplied to a source node, the output being based on a clock signal supplied to a gate node, a second transistor to which the pulse output from the drain node is supplied, and a capacitance element having one end coupled to the drain node and another end held at a predetermined potential. The capacitance element includes a first peripheral electrode formed of a same layer as the plurality of pixel electrodes, a wiring formed of a predetermined electrode layer, and an interlayer insulating film sandwiched between the first peripheral electrode and the wiring. The wiring includes a portion overlapping the second transistor in plan view.

BRIEF DESCRIPTION OF THE DRAWINGS

FIG. 14A to FIG. 14C are diagrams illustrating a configuration of the transmission circuit of the electro-optical device according to a second embodiment.

FIG. 15A to FIG. 15C are diagrams illustrating a configuration of the transmission circuit of the electro-optical device according to a third embodiment.

FIG. 16A to FIG. 16C are diagrams illustrating a modified example of the transmission circuit of the first embodiment and the like.

FIG. 19A to FIG. 19C are diagrams illustrating a configuration of the transmission circuit.

FIG. 20 is a diagram illustrating an example of an electronic apparatus using the electro-optical device according to the embodiments and the like.

DESCRIPTION OF EXEMPLARY EMBODIMENTS

An electro-optical device according to embodiments will be described below with reference to the drawings. Note that, in each drawing, dimensions and a scale of each of units may be different from the actual dimensions and scale of each of the units, as appropriate. Further, the embodiments described below are preferable specific examples of the present disclosure, and various limitations that are technically preferable are applied, but the scope of the present disclosure is not limited to these modes unless there is particular mention relating to limiting the present disclosure in the following description.

Figure 1:
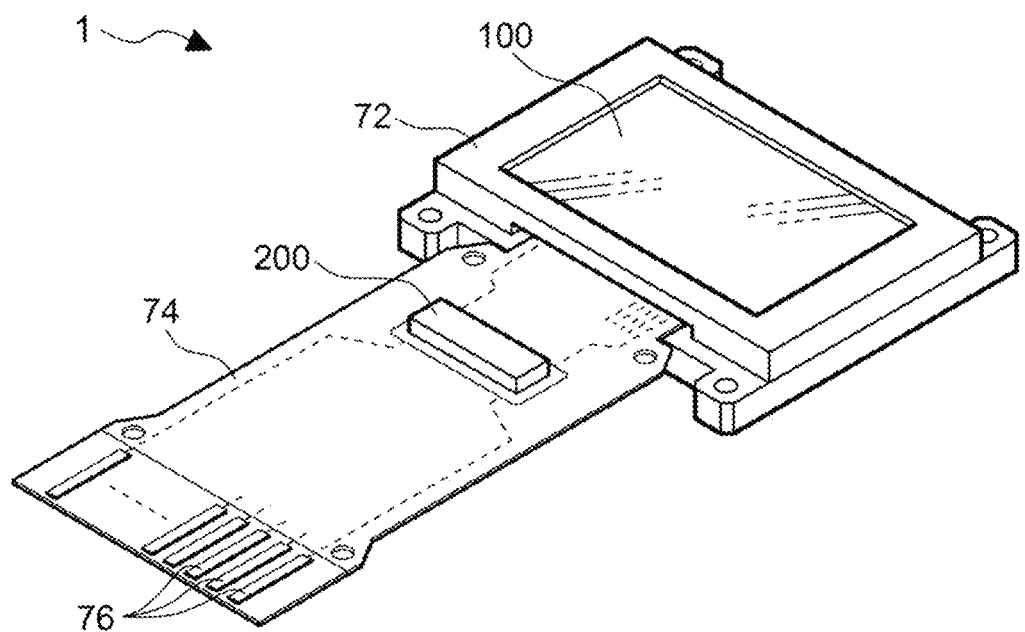
FIG. 1 is a perspective view illustrating a display module including an electro-optical device according to a first embodiment.

FIG. 1 is a perspective view illustrating a configuration of a display module 1 including an electro-optical device 100 according to a first embodiment.

The electro-optical device 100 is, for example, a transmissive liquid crystal panel used as a light valve of a liquid crystal projector. The electro-optical device 100 is housed in a frame-shaped case 72 that is open in an image display region. One end of an FPC substrate 74 is coupled to the electro-optical device 100. Note that FPC is an abbreviation for Flexible Printed Circuit. A plurality of terminals 76 are provided on the other end of the FPC substrate 74 and are coupled to an upper circuit (not illustrated).

A display control circuit 200 of a semiconductor chip is mounted on the FPC substrate 74, and image data synchronized with synchronization signals are supplied to the FPC substrate 74 from the upper circuit via the plurality of terminals 76. The image data specifies a gray scale level, in 8 bits, for example, of pixels of an image to be displayed.

Note that when the electro-optical device 100 is used as the light valve of the liquid crystal projector, as described below, a transmission image is synthesized by three of the electro-optical devices 100 corresponding to R (red), G (green), and B (blue), which are primary colors, and a color image is represented. Thus, in this case, strictly speaking, the pixel in one of the electro-optical devices 100 refers to one of three primary color sub-pixels that configure one of the pixels in the color image.

Further, the synchronization signals include a vertical synchronization signal instructing a start of scanning of the pixel circuits arranged in a matrix, a horizontal synchronization signal instructing a start of horizontal scanning of a single row in the above-described arrangement, and a clock signal indicating a timing of one of the pixels of the image data.

The display control circuit 200 processes the video data and the synchronization signals, and outputs data signals and control signals necessary to drive the electro-optical device 100. The data signal is a signal converted to analog so that the image data is suited to driving of the electro-optical device 100, and the control signal is a signal for the vertical scanning and the horizontal scanning in the electro-optical device 100.

Note that, rather than being mounted on the FPC substrate 74, the display control circuit 200 may be provided on the upper circuit and may have a configuration in which image signals and the control signals are supplied via the terminals 76.

Figure 2:
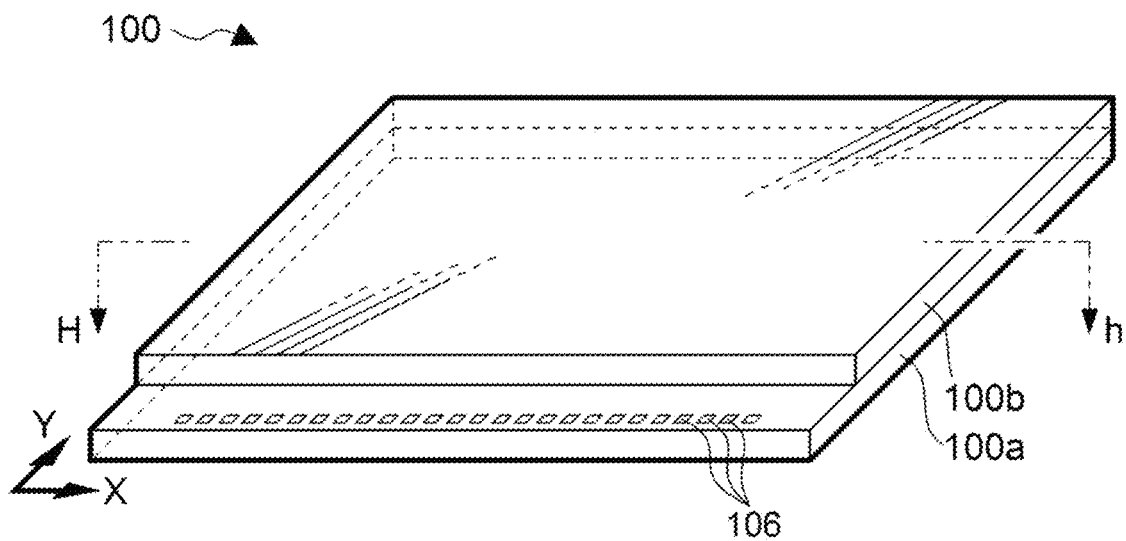
FIG. 2 is a perspective view illustrating the electro-optical device.
Figure 3:
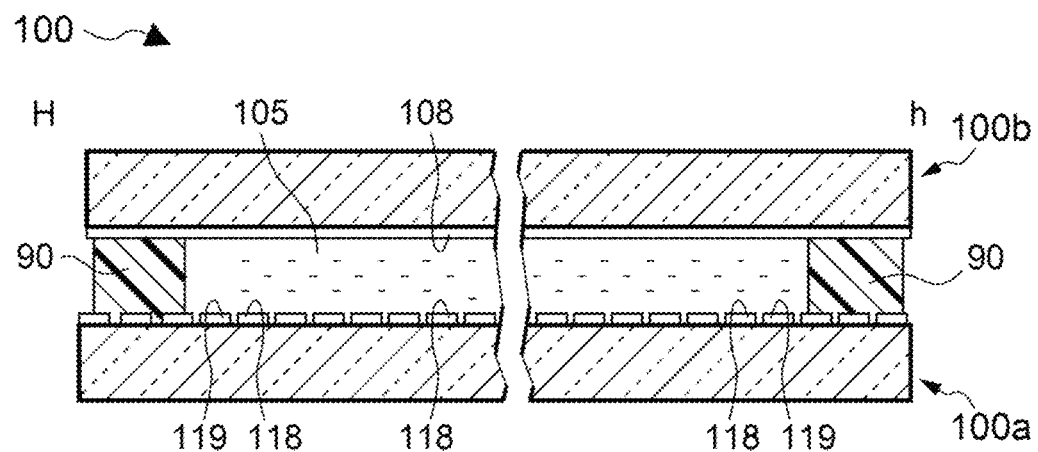
FIG. 3 is an cross-sectional view illustrating a structure of the electro-optical device.

FIG. 2 is a perspective view illustrating the structure of the electro-optical device 100, and FIG. 3 is a cross-sectional view taken along a line H-h in FIG. 2. As illustrated in FIG. 2 and FIG. 3, the electro-optical device 100 has a structure in which an element substrate 100a on which pixel electrodes 118, peripheral electrodes 119, and the like are provided, and a counter substrate 100b on which a common electrode 108 is provided are adhered together such that surfaces on which the electrodes are formed face each other while a uniform gap is maintained therebetween by a seal material 90 including a spacer (not illustrated), and a liquid crystal 105 is sandwiched in the gap.

A light-transmissive substrate, such as glass or quartz, is used as each of the element substrate 100a and the counter substrate 100b. As illustrated in FIG. 2, one side of the element substrate 100a projects further than the counter substrate 100b. A plurality of terminals 106 are provided in this projecting region, along an X direction. The one end of the FPC substrate 74 illustrated in FIG. 1 is coupled to the plurality of terminals 106, and the various signals and the like described above are supplied.

The pixel electrodes 118 and the peripheral electrodes 119 are formed by patterning a translucent metal layer, such as ITO, for example, on the surface of the element substrate 100a facing the counter substrate 100b. Note that ITO is an abbreviation for Indium Tin Oxide. Further, in the present embodiment, the peripheral electrodes 119 are divided into two types as described below.

The common electrode 108 provided on the counter substrate 100b is a solid electrode formed from a metal layer such as ITO, and a voltage LCcom that is substantially temporally constant is applied thereto. Note that "solid" means that the deposited metal layer is used as it is without etching or the like.

The seal material 90 is formed in a frame shape along the inner edge of the counter substrate 100b in plan view, although this is not particularly illustrated in the drawings.

The plurality of terminals 106 include terminals to which the voltage LCcom is applied. These terminals are coupled to the common electrode 108, via wiring provided on the element substrate 100a, and a silver paste provided in the vicinity of the sealing material 90, in this order. In other words, the element substrate 100a includes wiring used for applying the voltage LCcom.

Further, an oriented film is provided on each of the facing surface of the element substrate 100a and the facing surface of the counter substrate 100b, but the oriented films are not illustrated in the drawings.

Figure 4:
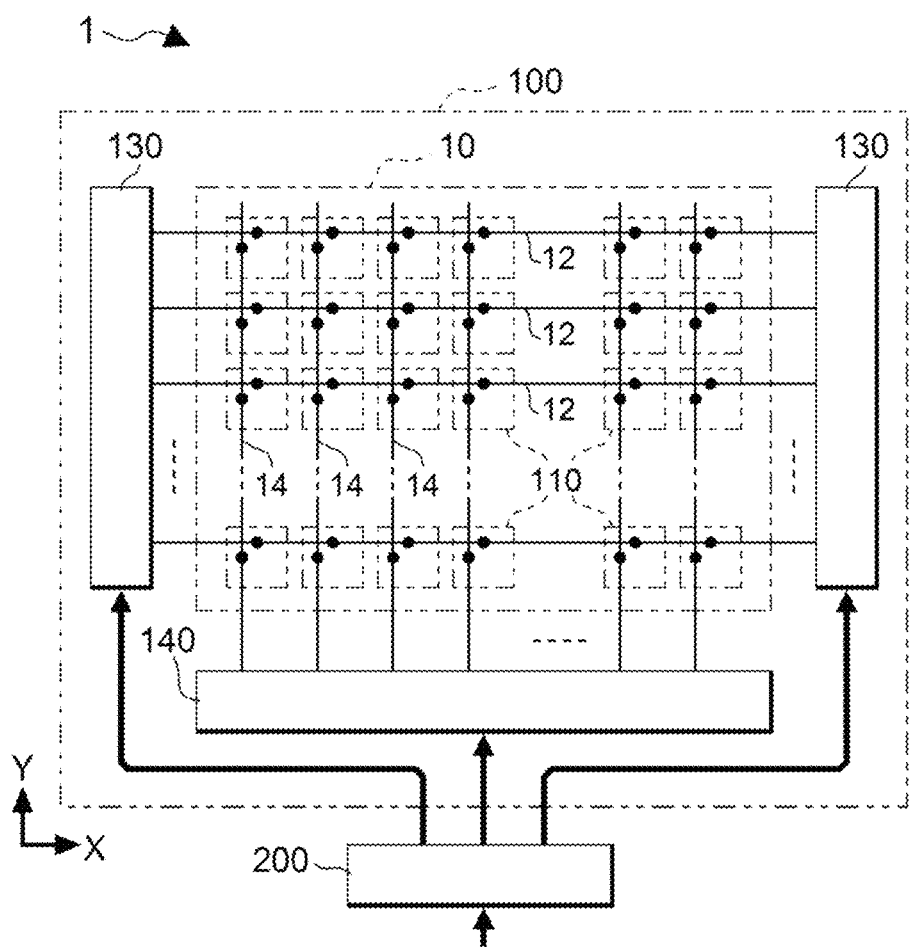
FIG. 4 is a block diagram illustrating an electrical configuration of the electro-optical device.

FIG. 4 is an block diagram illustrating an electrical configuration of the display module 1. Scanning line drive circuits 130 and a data line drive circuit 140 are provided on peripheral edges of a display region 10 on the electro-optical device 100.

In the display region 10 of the electro-optical device 100, pixel circuits 110 corresponding to the pixels of the image to be displayed are arranged in a matrix. In more detail, in the display region 10, a plurality of scanning lines 12 are provided extending in the X direction in FIG. 4, and a plurality of data lines 14 extend in a Y direction, and the data lines 14 and the scanning lines 12 are provided so as to be electrically insulated from each other. Then, the pixel circuits 110 are provided corresponding to intersections between the plurality of scanning lines 12 and the plurality of data lines 14.

Note that the X direction is an example of a "first direction", and the Y direction is an example of a "second direction".

When a number of the scanning lines 12 is m and a number of the data lines 14 is n, the pixel circuits 110 are arranged in the matrix of m rows in the vertical direction and n columns in the horizontal direction. Both m and n are integers equal to or greater than two. With respect to the scanning lines 12 and the pixel circuits 110, in order to distinguish the rows of the matrix from each other, the rows may be referred to in order from the top in FIG. 4 as 1, 2, 3, . . . , (m−1), and may be referred to as m rows. Similarly, with respect to the data lines 14 and the pixel circuits 110, in order to distinguish the columns from each other, the columns may be referred to in order from the left in FIG. 4 as 1, 2, 3, . . . , (n−1), and may be referred to as n columns.

For convenience of explanation, the configuration of the pixel circuit 110 will be described.

Figure 5:
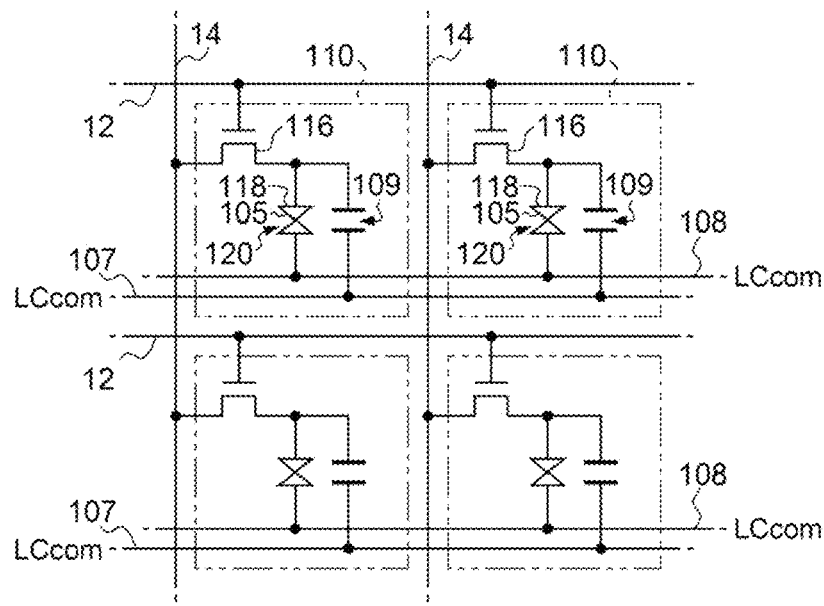
FIG. 5 is a diagram illustrating a configuration of pixel circuits in the electro-optical device.

FIG. 5 is a diagram illustrating equivalent circuits of a total of four (two rows and two columns) of the pixel circuits 110 corresponding to intersections between two of the adjacent scanning lines 12 and two of the adjacent data lines 14.

As illustrated in FIG. 5, the pixel circuit 110 includes a transistor 116 and a liquid crystal element 120. The transistor 116 is, for example, an n-channel thin film transistor. In the pixel circuit 110, a gate node of the transistor 116 is coupled to the scanning line 12, a source node thereof is coupled to the data line 14, and a drain node thereof is coupled to the pixel electrode 118 that is patterned in a substantially square shape in plan view.

The common electrode 108 is provided so as to face the pixel electrodes 118 and is provided in common for all the pixels, and the voltage LCcom is applied thereto. Then, the liquid crystal 105 is sandwiched between the pixel electrodes 118 and the common electrode 108, as described above. Accordingly, for each of the pixel circuits 110, the liquid crystal element 120 is configured by the pixel electrode 118, the common electrode 108, and the liquid crystal 105.

Further, a storage capacitor 109 is provided in parallel with the liquid crystal element 120. One end of the storage capacitor 109 is coupled to the pixel electrode 118, while the other end is coupled to a capacitance line 107. A temporally constant voltage is applied to the capacitance line 107, and is, for example, the same voltage LCcom as the voltage applied to the common electrode 108. The pixel circuits 110 are arranged in the X direction, which is the extending direction of the scanning lines 12, and in the Y direction, which is the extending direction of the data lines 14, and thus the pixel electrodes 118 included in the pixel circuits 110 are also arranged in the Y direction and the X direction.

Returning the description to FIG. 4, in accordance with control by the display control circuit 200, the scanning line drive circuit 130 selects the scanning lines 12 one by one in the order of the 1st, 2nd, 3rd, . . . , m-th row, for example, and sets the scanning signal to the selected scanning line 12 to an H level. Note that the scanning line drive circuit 130 sets the scanning signals to the scanning lines 12 other than the selected scanning line 12 to an L level.

During a period in which the scanning signal to a given one of the scanning lines 12 is at the H level, with respect to the pixel circuit 110 positioned on that scanning line 12, the data line drive circuit 140 supplies a data signal corresponding to a gray scale of the pixel to be represented by that pixel circuit 110 to the data line 14 corresponding to that pixel circuit 110.

In the scanning line 12 in which the scanning signal is at the H level, the transistor 116 of the pixel circuit 110 provided corresponding to the scanning line 12 is turned on. As a result of the transistor 116 being turned on, the data line 14 and the pixel electrode 118 enter a state of being electrically coupled, and the data signal supplied to the data line 14 reaches the pixel electrode 118 via the transistor 116 that has been turned on. When the scanning line 12 is at the L level, the transistor 116 is turned off, but the voltage of the data signal that has reached the pixel electrode 118 is retained by the capacitive properties of the liquid crystal element 120 and by the storage capacitor 109.

As is known, in the liquid crystal element 120, an oriented state of the liquid crystal 105 changes in accordance with an electric field generated by the pixel electrode 118 and the common electrode 108. Accordingly, the liquid crystal element 120 has a transmittance corresponding to an effective value of the applied voltage. Thus, in the electro-optical device 100, the transmittance changes for each of the liquid crystal elements 120 of the pixel circuits 110.

As a result of such a voltage retention operation being performed on the liquid crystal elements 120 in the order of the 1st, 2nd, 3rd, . . . , m-th rows, the voltage is retained according to the data signal, in each of the liquid crystal elements 120 of the pixel circuits 110 arranged in the m rows and n columns. As a result of such a voltage retention, each of the liquid crystal elements 120 has a target transmittance, and an image formed from the pixels arranged in the m rows and n columns is generated.

Note that, in FIG. 4, two of the scanning line drive circuits 130 are provided, and a configuration is employed in which the scanning signal is supplied from both ends to the scanning lines 12. The reason for this configuration is to suppress an influence on display caused by a scanning signal delay, in comparison to a case in which the scanning signal is supplied from only one end.

Further, in the display region 10, the pixel electrodes 118 are arranged in the matrix of the m rows in the vertical direction and the n columns in the horizontal direction, and the peripheral electrodes 119 are provided outside the display region 10. Since the peripheral electrodes 119 do not contribute to the display, the peripheral electrodes 119 are omitted from FIG. 4 and FIG. 5.

As described above, the scanning line drive circuit 130 causes the scanning signal supplied to the scanning lines 12 of the 1st, 2nd, 3rd, . . . , m-th rows to be sequentially and exclusively at the H level. Here, the scanning line drive circuit 130 that outputs the scanning signal in this way will be described.

Figure 6:
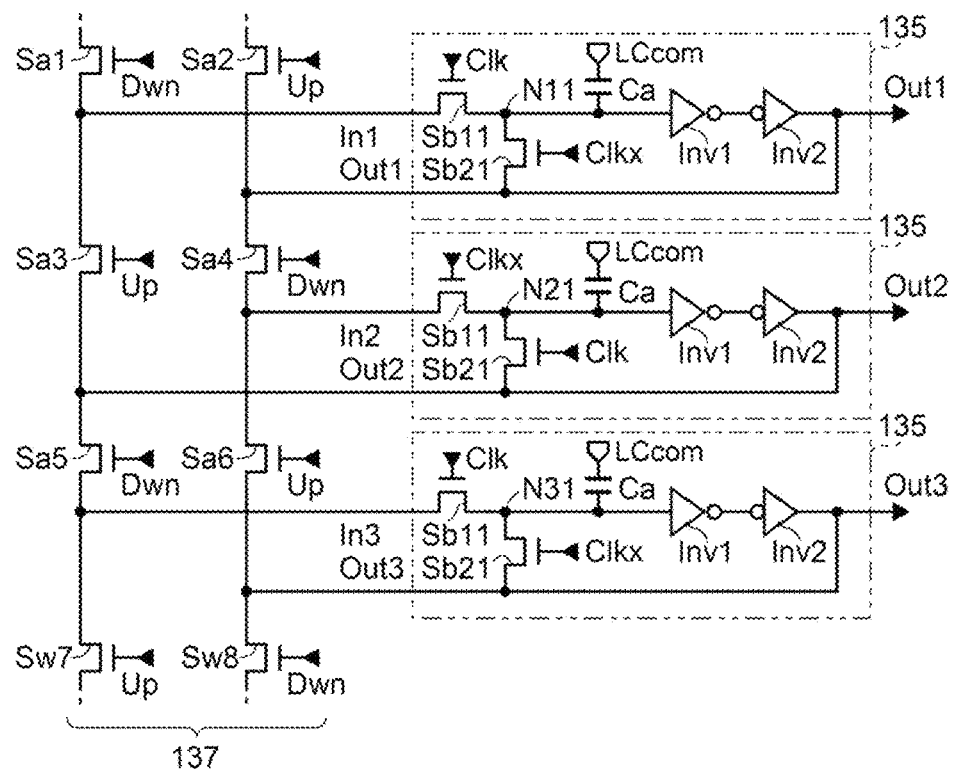
FIG. 6 is a circuit diagram illustrating main portions of a scanning line drive circuit in the electro-optical device.

FIG. 6 is a circuit diagram illustrating a configuration of main portions of the signal line drive circuit 130.

The scanning line drive circuit 130 can correspond to either a case in which the scanning lines 12 are selected in a sequence in a direction from the 1st row to the m-th row, and conversely, a case in which the scanning lines 12 are selected in a sequence in a direction from the m-th row to the 1st row. The reason for enabling the selection of the scanning lines 12 to correspond to either direction is that the orientation of the image to be generated needs to be reversed when a liquid crystal projector incorporating the electro-optical device 100 is installed on a table and when hanging from a ceiling.

Further, the main portions of the scanning line drive circuit 130 illustrated in FIG. 6 include transmission circuits 135 for shifting a start pulse, which is a transfer target, by a half-cycle of the clock signal, and a path selection circuit 137 that selects a transmission path for the start pulse shifted by the transmission circuit 135.

Note that the scanning line drive circuit 130 includes a circuit for determining a logical product signal between the signals output from the adjacent transmission circuits 135, but this is not important in the present case, and is therefore omitted.

A number of stages of the transmission circuits 135 is greater than the number m of the scanning lines 12, and is, for example, (m+1) stages. Further, the shift register that sequentially shifts the start pulse is configured by the (m+1) stages of the transmission circuits 135.

In FIG. 6, in order to simplify the description, a section of three stages of the transmission circuits 135 of the scanning line drive circuit 130 is extracted and described. Here, in order to distinguish between the transmission circuits 135, a first stage, a second stage, and a third stage are in that order from the top.

The transmission circuit 135 includes transistors Sb11 and Sb21, a capacitance element Ca, and NOT circuits Inv1 and Inv2.

The configuration of each of the transmission circuits 135 is common except that a signal supplied to a gate node of the transistor Sb11 and a signal supplied to a gate node of the transistor Sb21 are switched between odd and even numbered stages. In more detail, in the transmission circuit 135 of the odd numbered stage, a clock signal Clk is supplied to the gate node of the transistor Sb11, and a clock signal Clkx is supplied to the gate node of the transistor Sb21, while in the transmission circuit 135 of the even numbered stage, the clock signal Clkx is supplied to the gate node of the transistor Sb11, and the clock signal Clk is supplied to the gate node of the transistor Sb21.

The transmission circuit 135 of the first stage will be described as an example. An input end In1 of the transmission circuit 135 is coupled to a source node of the transistor Sb11, and a drain node of the transistor Sb11 is coupled to one end of the capacitance element Ca, an input end of the NOT circuit Inv1, and a source node of the transistor Sb21.

Note that the transistor Sb11 is an example of a first transistor that captures a pulse supplied to the source node, using a clock signal supplied to the gate node, and performs output from the drain node.

An output end of the NOT circuit Inv1 is coupled to an input end of a NOT circuit Inv2, and an output end of the NOT circuit Inv2 is coupled to a drain node of the transistor Sb21. Although not particularly illustrated in FIG. 6, the NOT circuit Inv1 has a complementary configuration in which a p-channel transistor and an n-channel transistor are provided in series between a signal line to which a higher voltage of a power supply is applied and a signal line to which a lower voltage of the power supply is applied. The NOT circuit Inv2 also has a complementary configuration similar to that of the NOT circuit Inv1.

Note that at least one of the p-channel transistor and the n-channel transistor configuring the NOT circuit Inv1 is an example of a second transistor that inputs the pulse output from the drain node of the transistor Sb11.

Further, the output end of the NOT circuit Inv2 is the output end Out1 of the transmission circuit 135.

A voltage that is substantially temporally constant is applied to the other end of the capacitance element Ca, and in the present embodiment is, for example, the same voltage LCcom as that applied to the common electrode 108. Note that the capacitance element Ca is an example of a capacitance element of which one end is coupled to the drain node of the transistor Sb11 and the other end is held at a predetermined potential.

For convenience of explanation, in the first stage transmission circuit 135, a coupling point of the drain node of the transistor Sb11, the one end of the capacitance element Ca, the input end of the NOT circuit Inv1, and the source node of the transistor Sb21 is denoted by N11.

Similarly, in the second stage transmission circuit 135, a coupling point of the drain node of the transistor Sb11 and the like is denoted by N21, and in the third stage transmission circuit 135, a coupling point of the drain node of the transistor Sb11 and the like is denoted by N31.

The pathway selection circuit 137 includes n-channel transistors Sa1 to Sa8.

Control signals Dwn are supplied to gate nodes of the transistors Sa1, Sa4, Say, and Sa8, and control signals UP are supplied to gate nodes of the transistors Sa2, Sa3, Sa6, and Sa1, respectively, from the display control circuit 200. The control signal Dwn is at the H level when the scanning lines 12 are sequentially selected in the direction from the first row to the m-th row, and otherwise is at the L level. The control signal Up is at the H level when the scanning lines 12 are sequentially selected in the direction from the m-th row to the first row, and otherwise is at the L level.

The transistors Sa1, Sa3, Say, and Sa7 are coupled in series. Coupling points of the transistors Sa1 and Sa3 are coupled to the input end In1 of the first stage transmission circuit 135, coupling points of the transistors Sa3 and Say are coupled to an output end Out2 of the second stage transmission circuit 135, and coupling points of the transistors Sa5 and Sa7 are coupled to an input end In3 of the third stage transmission circuit 135.

The transistors Sa2, Sa4, Sa6, and Sa8 are coupled in series. Coupling points of the transistors Sa2 and Sa4 are coupled to an output end Out1 of the first stage transmission circuit 135, coupling points of the transistors Sa4 and Sa6 are coupled to an input end In2 in the second stage transmission circuit 135, and coupling points of the transistors Sa6 and Sa8 are coupled to an output end Out3 of the third stage transmission circuit 135.

Figure 7:
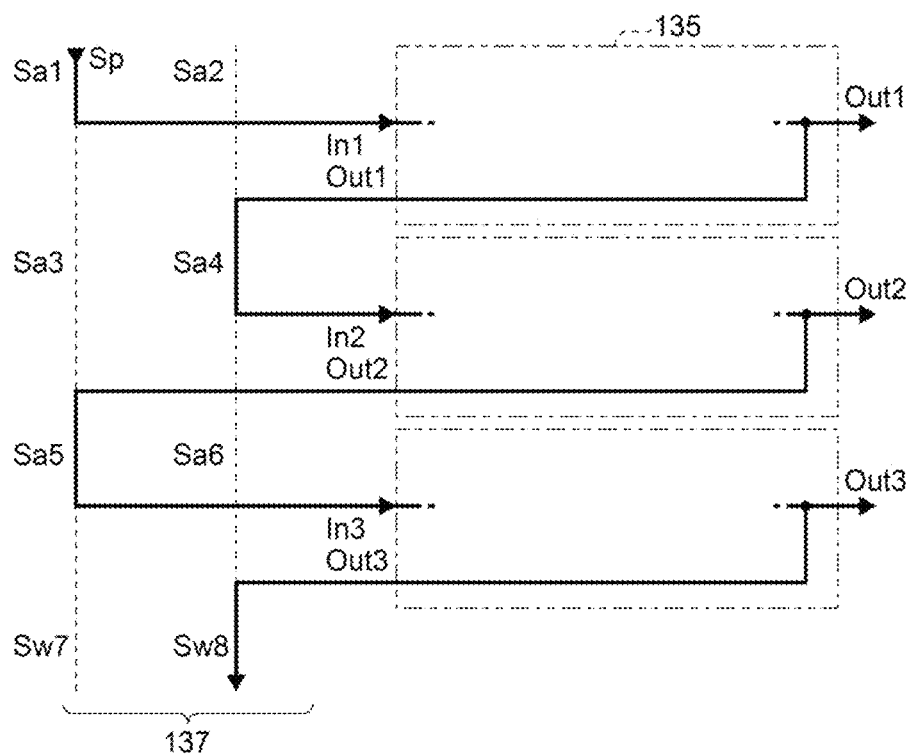
FIG. 7 is a diagram illustrating an operation of a path selection circuit in the main portions.

In the path selection circuit 137, when the control signal Dwn is at the H level and the control signal Up is at the L level, the transistors Sa1, Sa4, Say, and Sa8 are turned on and the transistors Sa2, Sa3, Sa6, and Sa7 are turned off. Thus, the coupling of the input ends and the output ends of the transmission circuit 135 of each of the stages is as illustrated in FIG. 7. Specifically, in this case, the output end Out1 is coupled to the input end In2, and the output end Out2 is coupled to the input end In3.

Figure 8:
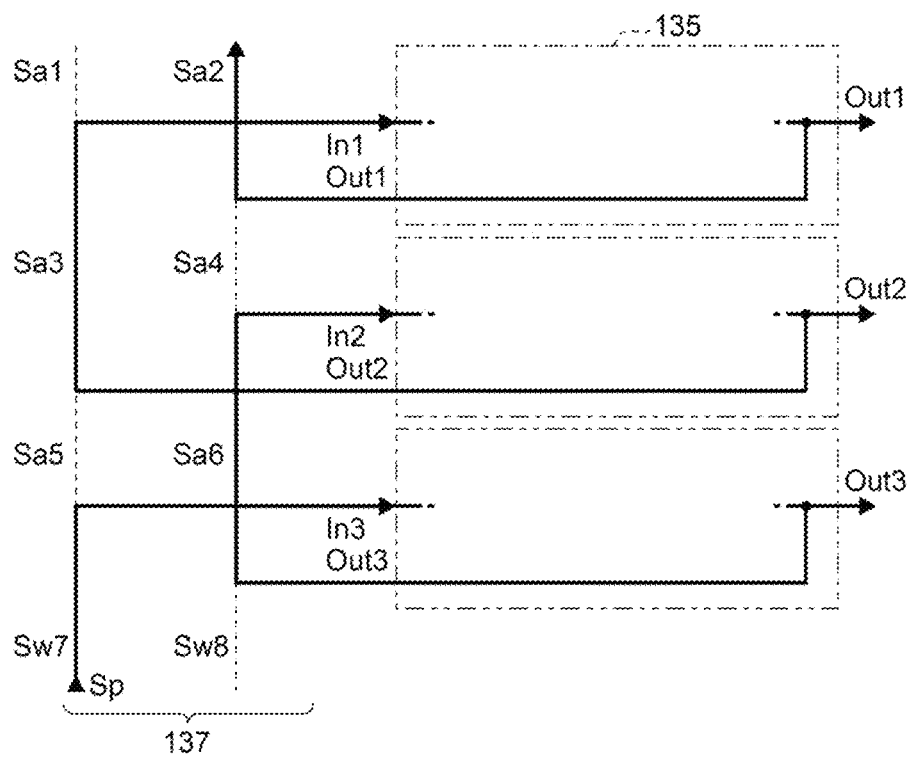
FIG. 8 is a diagram illustrating an operation of the path selection circuit in the main portions.

Further, in the path selection circuit 137, when the control signal Dwn is at the L level and the control signal Up is at the H level, the transistors Sa1, Sa4, Say, and Sa8 are turned off, and the transistors Sa2, Sa3, Sa6, and Sa7 are turned on. Thus, the coupling of the input ends and the output ends of the transmission circuit 135 in each of the stages is as illustrated in FIG. 8. Specifically, in this case, the output end Out3 is coupled to the input end In2, and the output end Out2 is coupled to the input end In1.

Note that, below, a description will be given of operations of the main portions of the scanning line drive circuit 130 in a case in which, in the path selection circuit 137, the control signal Dwn is at the H level and the control signal Up is at the L level.

Figure 9:
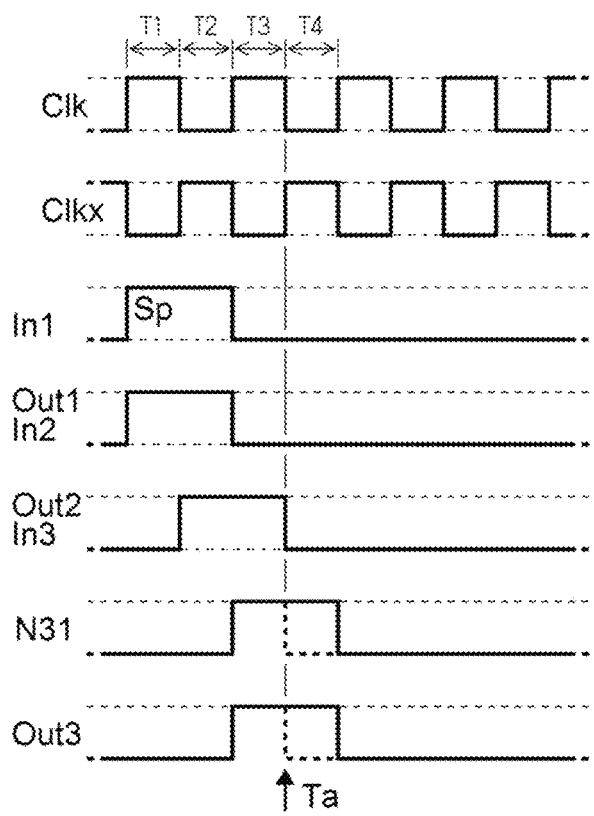
FIG. 9 is a diagram for describing an operation of a transmission circuit in the main portions.

FIG. 9 is a diagram for describing the operation in the main portions of the scanning line drive circuit 130. Note that, hereinafter, the operation of the main portions will be described based on the assumption of a state in which, for ease of explanation, the capacitance elements Ca are not present in the transmission circuit 135 of each of the stages.

The clock signals Clk and Clkx are supplied from the display control circuit 200, have a substantially constant cycle, and are at mutually exclusive logic levels.

A start pulse Sp having a period length corresponding to one cycle of the clock signals Clk and Clkx is supplied by the display control circuit 200 to the input end In1 in the first stage transmission circuit 135. In more detail, the start pulse Sp is supplied to the input end In1 over a time period T1 in which the clock signal Clk is at the H level and a time period T2 in which the clock signal Clk is at the L level following the period T1.

In the period T1, due to the H level of the clock signal Clk, the transistor Sb11 in the first stage transmission circuit 135 is turned on, and, due to the L level of the clock signal Clkx, the transistor Sb21 in the transmission circuit 135 in the same stage is turned off. Thus, in the period T1, since the coupling point N11 is at the same H level as the start pulse Sp supplied to the input end In1, and the H level is output from the output end Out1 via the NOT circuits Inv1 and Inv2, the output end Out1 is at the H level.

In the period T2, due to the L level of the clock signal Clk, the transistor Sb11 in the first stage transmission circuit 135 is turned off, and due to the H level of the clock signal Clkx, the transistor Sb21 in the transmission circuit 135 in the same stage is turned on. Thus, in the period T2, the H level at the coupling point N11 is held by being circulated in the NOT circuits Inv1 and Inv2, and therefore the output end Out1 is maintained at the H level.

Further, in the period T2, the transistor Sb11 in the second stage transmission circuit 135 is turned on, and the transistor Sb21 in the transmission circuit 135 in the same stage is turned off. Thus, in the period T2, the coupling point N21 is at the H level of the output end Out1 (the input end In2), and since the H level is output from the output end Out2 via the NOT circuits Inv1 and Inv2, the output end Out2 is at the H level.

In a period T3, due to the H level of the clock signal Clk, the transistor Sb11 in the first stage transmission circuit 135 is turned on, and, due to the L level of the clock signal Clkx, the transistor Sb21 in the transmission circuit 135 in the same stage is turned off. Thus, in the period T3, the coupling point N11 is at the same L level as the start pulse Sp supplied to the input end In1, and since the L level is output from the output end Out1 via the NOT circuits Inv1 and Inv2, the output end Out1 is at the L level.

In the period T3, the transistor Sb11 in the second stage transmission circuit 135 is turned off, and the transistor Sb21 in the transmission circuit 135 in the same stage is turned on. Thus, in the period T3, the H level at the coupling point N21 is held by being circulated in the NOT circuits Inv1 and Inv2, and therefore the output end Out2 is maintained at the H level.

Further, in the period T3, in the third stage transmission circuit 135, similarly to the first stage, the transistor Sb1 is turned on and the transistor Sb21 is turned off. Thus, in the period T3, the coupling point N31 is at the H level of the output end Out2 (the input end In3), and since the H level is output from the output end Out3 via the NOT circuits Inv1 and Inv2, the output end Out3 is at the H level.

In a period T4, due to the H level of the clock signal Clkx, the transistor Sb11 in the second stage transmission circuit 135 is turned on, and due to the L level of the clock signal Clk, the transistor Sb21 in the transmission circuit 135 in the same stage is turned off. Thus, in the period T4, the coupling point N21 is at the same L level as the start pulse Sp supplied to the input end In2, and since the L level is output from the output end Out2 via the NOT circuits Inv1 and Inv2, the output end Out2 is at the L level.

In the period T4, the transistor Sb11 in the third stage transmission circuit 135 is turned off, and due to the H level of the clock signal Clkx, the transistor Sb21 in the transmission circuit 135 in the same stage is turned on. Thus, in the period T4, the H level at the coupling point N31 is held by being circulated in the NOT circuits Inv1 and Inv2, and therefore the output end Out3 is maintained at the H level.

Further, in FIG. 6, the fourth stage and subsequent transmission circuits 135 are omitted, but in the period T4, the output end of the transmission circuit 135 in the fourth stage is at the H level.

Note that, although not particularly illustrated in the drawings, a relationship between the output signal of the transmission circuit 135 in each stage and the scanning signal to the scanning line 12 in each row is the following relationship. Specifically, for example, a logical product signal of the signal output from the output end Out1 of the first stage transmission circuit 135 and the signal output from the output end Out2 of the second stage transmission circuit 135 is supplied as the scanning signal to the scanning line 12 in the first row. A logical product signal of the signal output from the output end Out2 of the second stage transmission circuit 135 and the signal output from the output end Out3 of the third stage transmission circuit 135 is supplied as the scanning signal to the second scanning line 12. Note that, in practical terms, a configuration is adopted in which a separate output control signal is input, another logical product signal is further generated by the output control signal and the logical product signal concerned and is input to a buffer circuit, and an output signal of the buffer circuit is supplied to the scanning line 12.

Assuming the configuration in which, in the main portions of the scanning line drive circuit 130, the capacitance element Ca is not provided, when the start pulse Sp is supplied to the input end In1 in the first stage transmission circuit 135, the start pulse Sp is output from the output end Out1, and should be shifted by a half-cycle of each of the clock signals Clk and Clkx and output by the second stage, third stage, fourth stage and subsequent transmission circuits 135.

However, when the capacitance element Ca is not provided, the following failures were confirmed.

Specifically, when focusing on the third stage transmission circuit 135, for example, where the coupling point N31 should be maintained at the H level, as indicated by a solid line, over the period T3 to the period T4, the coupling point N31 changes to the L level at a timing Ta of an end phase of the period T3 (a start phase of the period T4), as indicated by a dashed line. This point will be described with reference to FIG. 10.

Figure 10:
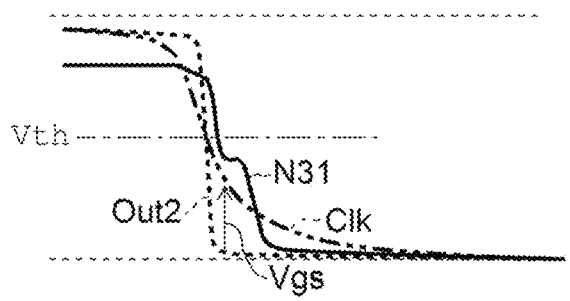
FIG. 10 is a diagram for describing a failure in the transmission circuit.
Figure 11:
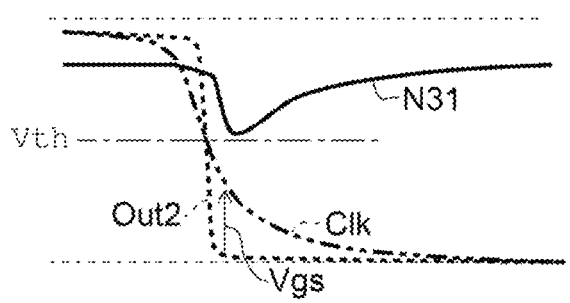
FIG. 11 is a diagram for describing an improvement in the transmission circuit.

FIG. 10 and FIG. 11 are diagrams illustrating voltage waveforms of each of portions in the vicinity of the timing Ta, where FIG. 10 illustrates a case in which the capacitance element Ca is not present, and FIG. 11 illustrates a case in which the capacitance element C is present. At the timing Ta, the clock signal Clk changes from the H level to the L level, but in actuality, the waveform of the clock signal Clk is blunted as a result of wiring resistance, parasitic capacitance, and the like. Note that, although not illustrated, the waveform of the clock signal Clkx is also blunted in the same manner as the clock signal Clk.

In contrast, since the signal output from the output end Out2 of the previous stage transmission circuit 135 is waveform shaped by the NOT circuits Inv1 and Inv2, the signal changes abruptly in comparison to the clock signal Clk. Thus, in the third stage transistor Sb11, a voltage Vgs of the gate node based on the source node is greater than zero, and therefore resistance between the source and drain nodes is reduced. Since the resistance between the source and drain nodes is reduced, the voltage at the coupling point N31, which is the drain node, drops following the voltage of the clock signal Clk of the blunt waveform.

Further, at the timing Ta, when the output end Out2 changes from the H level to the L level, due to the capacitive coupling, the level change is transmitted to the coupling point N31, thus reducing the voltage at the coupling point N31.

Although the voltage at the coupling point N31 at the timing Ta should be maintained at the H level, it is reduced, mainly as a result of the two points described above. When the voltage at the coupling point N31 falls below a threshold Vth of the NOT circuit Inv1, the output end Out3 is inverted to the L level. After the timing Ta, since the clock signal Clkx changes to the H level and the transistor Sb21 is turned on, once the output end Out3 is inverted to the L level, the L level is held.

Note that the third stage transmission circuit 135 is described here, but similar failures may occur in each of the stages.

In the present embodiment, in the configuration in which the transistor Sb11 of the transmission circuit 135 transfers the signal supplied to the source node to the drain node in accordance with the clock signal Clk or Clkx, the one end of the capacitance element Ca is coupled to the coupling point N31, which is the drain node, the other end of the capacitance element Ca is held at the constant potential, and the voltage at the coupling point N31 is less likely to change.

In more detail, as illustrated in FIG. 11, even if the resistance between the source and drain nodes in the transistor Sb11 becomes low, the voltage at the coupling point N31 is less likely to drop following the clock signal Clk, due to the capacitance element Ca. Further, when the output end Out2 changes from the H level to the L level, even if the change is transmitted to the coupling point N31, the voltage at the coupling point N31 is less likely to fall, due to the capacitance element Ca.

Thus, by providing the capacitance element Ca in this manner, a situation is suppressed in which the coupling point N31 falls below the threshold value Vth and is inverted to the L level.

Note that although the third stage transmission circuit 135 is described here, the similar capacitance element Ca is also provided in the other stages.

Next, a description will be given about which of the layers of the scanning line drive circuit 130 is used to form the capacitance element Ca illustrated in FIG. 6.

In the electro-optical device 100 used as the light valve of the liquid crystal projector, the transistor 116 is provided for each of the pixel circuits 110 in the display region 10, and the transistors Sb11, Sb21, and the like of the scanning line drive circuit 130, for example, are provided outside the display region 10. The transistors configuring the pixel circuits 110 and the scanning line drive circuits 130 are formed in the element substrate 100a using, for example, a high-temperature polysilicon process.

In the element substrate 100a, the scanning line 12 coupled to the gate node of the transistor 116 and the data line 14 coupled to the source node of the transistor 116 are provided so as to intersect each other, and, further, the individual pixel electrodes 118 are provided for each of the pixels. Thus, a structure including an electrode layer and an insulating film, as described below, is assumed as the element substrate 100a.

In more detail, a structure is assumed in which a polysilicon film, a gate insulating film, a gate electrode layer, a first interlayer insulating film, a first electrode layer, a second interlayer insulating film, a second electrode layer, a third interlayer insulating film, and a third electrode layer of the transistor are formed in this order on a substrate having transparency and insulating properties.

In this type of assumed structure, with respect to the capacitance element Ca, first, a configuration is conceivable in which the first interlayer insulating film is sandwiched by wiring formed by patterning the gate electrode layer and wiring formed by patterning the first electrode layer.

However, in recent years, in line with miniaturization, more specifically, with the miniaturization and resolution enhancement of electro-optical devices, it is becoming difficult to form one of the electrodes in the capacitance element Ca by patterning the first electrode layer.

Further, in order to improve light resistance, technology is being proposed in which, in order to secure sufficient capacity in the storage capacitor 109, the storage capacitor 109 is formed using a layered capacitance structure or a trench capacitance structure. With such a structure, since the first interlayer insulating film becomes thicker, there is a problem in that sufficient capacity cannot be secured in the capacitance element Ca in which the first interlayer insulating film is sandwiched by the two sets of wiring.

Next, with respect to the capacitance element Ca, a configuration is conceivable in which the second interlayer insulating film is sandwiched by the wiring formed by patterning the first electrode layer and wiring formed by patterning the second electrode layer.

However, in the display region 10, the data lines 14 are formed, for example, by the patterning of the first electrode layer, and the capacitance lines 107 are formed by the patterning of the second electrode layer. The second interlayer insulating film that is sandwiched by both the electrode layers in order to realize high speed driving along with the resolution enhancement of the electro-optical device becomes thicker, since it is necessary to reduce a degree of capacitive coupling between the wiring of both the electrode layers. The film thickness is, for example, 0.5 to 0.7 μm. Therefore, sufficient capacity cannot be secured for the capacitance element Ca in which the second interlayer insulating film is sandwiched by the wiring formed by the first electrode layer and the wiring formed by the second electrode layer.

Therefore, in the present embodiment, under the above-described assumption, a configuration is employed for the capacitance element Ca in which the third interlayer insulating film is sandwiched by the wiring formed by patterning the second electrode layer and wiring formed by patterning the third electrode layer.

Figure 12A:
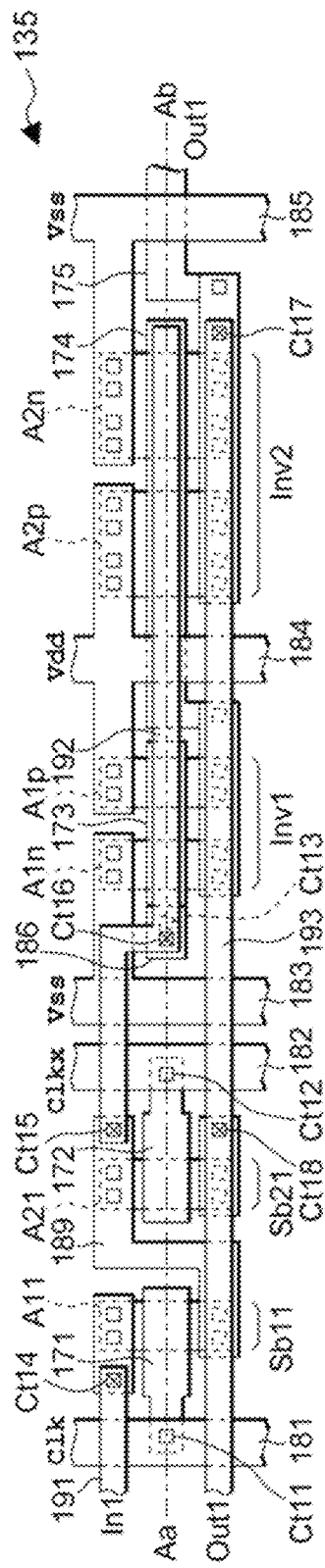
FIG. 12A to FIG. 12C are diagrams illustrating a configuration of the transmission circuit.
Figure 12B:
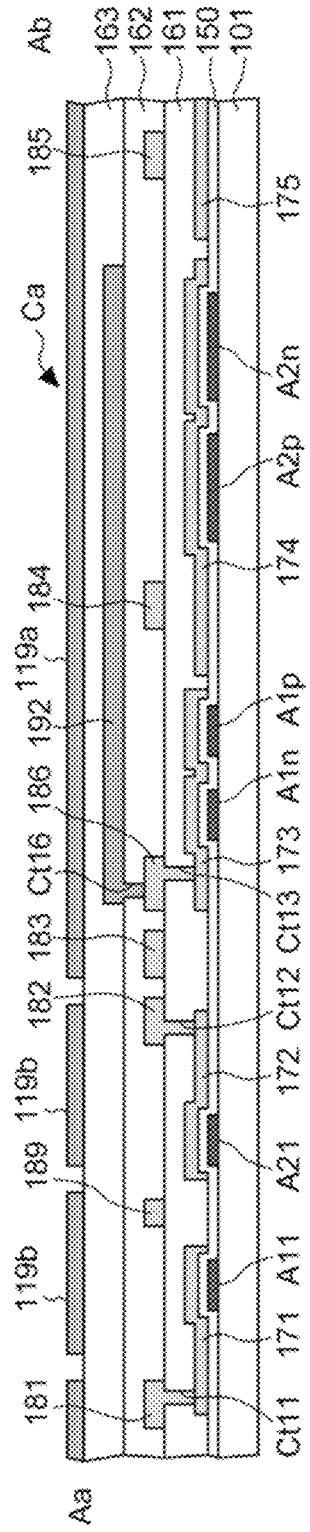
Figure 12C:
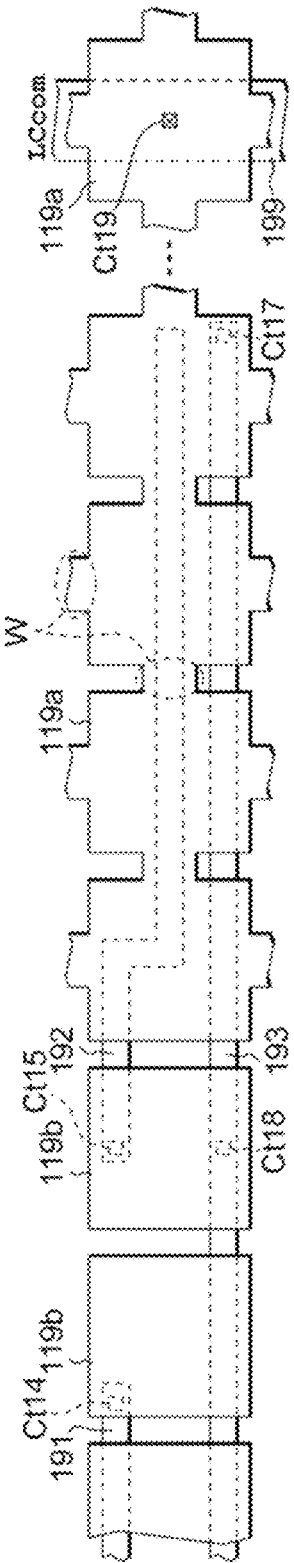

FIG. 12A to FIG. 12C are diagrams for describing the configuration of the transmission circuit 135. In more detail, FIG. 12A illustrates the configuration of the transmission circuit 135 in plan view, and, in order to avoid complication, is a diagram in which the semiconductor layer formed by patterning a polysilicon film, the gate nodes and the like formed by patterning the gate electrode layer, the wiring formed by patterning the first electrode layer, and the wiring formed by patterning the second electrode layer are illustrated, and the wiring formed by patterning the third electrode layer is omitted. FIG. 12B is a diagram illustrating the configuration of the transmission circuit 135 when cut along a line Aa-Ab illustrated in FIG. 12A. FIG. 12C is a diagram illustrating the configuration of the transmission circuit 135 in plan view, in which the wiring formed by patterning the second electrode layer and the wiring formed by patterning the third electrode layer are illustrated.

Note that in FIG. 12A and FIG. 12C, the upper direction is the Y direction in FIG. 4, and the rightward direction is the X direction.

In the following description, mainly the capacitance element Ca will be described with reference to FIG. 12B. Further, the transmission circuit 135 in the first stage will be described. In other words, the input end of the transmission circuit 135 is denoted by In1 and the output end thereof is denoted by Out1.

In FIG. 12B, the element substrate 101 forming a foundation of the element substrate 100a is provided with semiconductor layers A11, A21, A1n, A1p, A2p, and A2n formed by patterning a polysilicon film in an island shape. The semiconductor layer A11 configures the transistor Sb11, and the semiconductor layer A21 configures the transistor Sb2l. The semiconductor layer A1n configures the n-channel transistor of the NOT circuit Inv1, and the semiconductor layer A1p configures the p-channel transistor of the NOT circuit Inv1. Similarly, the semiconductor layer A2p configures the p-channel transistor of the NOT circuit Inv2, and the semiconductor layer A1p configures the n-channel transistor of the NOT circuit Inv2.

A gate insulating film 150 is provided covering the substrate 101, and the semiconductor layers A11, A21, A1n, A1p, A2p, and A2n. After forming a conductive gate electrode layer, such as a two-layer structure formed by a polysilicon film and a tungsten silicide film, on the front surface of the gate insulating film 150, the gate electrode layer is patterned to provide gate nodes 171, 172, 173, and 174, and wiring 175 for coupling.

Note that, in plan view, an overlapping region between the gate node 171 and the semiconductor layer A11 is a channel region of the transistor Sb11. Similarly, an overlapping region between the gate node 172 and the semiconductor layer A12 is a channel region of the transistor Sb21. An overlapping region between the gate node 173 and the semiconductor layer A1n is a channel region of the n-channel transistor in the NOT circuit Inv1, and an overlapping region between the gate node 173 and the semiconductor layer A1p is a channel region of the p-channel transistor in the NOT circuit Inv1. An overlapping region between the gate node 174 and the semiconductor layer A2p is a channel region of the p-channel transistor in the NOT circuit Inv2, and an overlapping region of the gate node 174 and the semiconductor layer A2n is a channel region of the n-channel transistor in NOT circuit Inv2.

Note that, when seen electrically, the wiring 175 is part of the output end Out1 of the transmission circuit 135.

A first interlayer insulating film 161 is provided covering the gate insulating film 150, the gate nodes 171, 172, 173, and 174, and the wiring 175. After forming the first interlayer insulating film 161, the flat surface thereof may be flattened by CMP. Note that CMP is an abbreviation for Chemical Mechanical Polishing. When cut along the line Aa-Ab, contact holes Ct11, Ct12, and Ct13 are provided in the first interlayer insulating film 161. Reference signs are omitted for some of the contact holes and part of the wiring, in order to avoid the drawings becoming complicated.

Note that, in the actual pixel circuit 110, the storage capacitor 109 is formed in the first interlayer insulating film 161 below the first electrode layer. The thickness of the first interlayer insulating film 161, that is, the thickness from the upper end of the gate electrode layer to the lower end of the first electrode layer, may reach several μm in the trench capacitance structure or the like described above. The thickness of the scanning line drive circuit 130 on the periphery of the display region 10 also has the same degree of thickness.

The conductive first electrode layer, such as aluminum, is formed on the front surface of the first interlayer insulating film 161, and wiring 181, 182, 183, 184, 185, 186, and 189 and the like are provided by the patterning of the first electrode layer. Note that the wiring 181, 182, 183, 184, and 185 are formed extending in the Y direction, that is in the upper direction on paper in FIG. 12A.

The clock signal Clk is supplied to the wiring 181, and the clock signal Clkx is supplied to the wiring 182. Of the power supply voltages of the NOT circuits Inv1 and Inv2, a high voltage Vdd is applied to the wiring line 184, and, of the above-mentioned power supply voltages, a low voltage Vss is applied to the wiring 183 and 185.

The wiring 181 is coupled to the gate node 171 via the contact hole Ct11, and the wiring 182 is coupled to the gate node 172 via the contact hole Ct12.

The wiring 183 is coupled to a source region of the semiconductor layer A1n via a contact hole marked by a square-shaped symbol in FIG. 12A, and the wiring 184 is coupled to a source region of the semiconductor layer A1p and a source region of the semiconductor layer A2p via contact holes. The wiring 185 is coupled to a source region of the semiconductor layer A2n via a contact hole.

The wiring 186 functions to form a relay between wiring 192 and the gate node 173 that are formed by the second electrode layer. Specifically, the wiring 186 is coupled to the wiring 192 via a contact hole Ct16, and is coupled to the gate node 173 via the contact hole Ct13.

As illustrated in FIG. 12A, the wiring 189 is coupled to a drain region of the semiconductor layer A11 via a contact hole, is coupled to the source region of the semiconductor layer A12 via a contact hole, and is coupled to the wiring 192 via a contact hole Ct15. Note that, when viewed electrically, the wiring 189, 192, and 186 and the gate node 173 are the coupling point N11.

A configuration may be employed in which, rather than filling the contact holes Ct11, Ct12, Ct13, and the like with the first electrode layer when forming the first electrode layer, the contact holes Ct11, Ct12, Ct13, and the like may be separately filled using a metal, such as tungsten or the like, or a configuration may be employed in which the contact holes Ct11, Ct12, Ct13, and the like form a relay between any one of the electrode layers configuring the storage capacitor 109.

A second interlayer insulating film 162 is provided covering the first interlayer insulating film 161, and the wiring 181, 182, 183, 184, 185, 186, 187, 189, and the like.

After forming the second interlayer insulating film 162, the flat surface thereof may be flattened by CMP. Contact holes Ct14, Ct15, Ct16, Ct17, and Ct18 are provided in the second interlayer insulating film 162. A conductive third electrode layer, such as aluminum, is formed on the front surface of the second interlayer insulating film 162, and wiring 191, 192, 193, and 199 are provided by the patterning of the second electrode layer.

As illustrated in FIG. 12A, the wiring 191 is the input end In1, and is coupled to the wiring formed by the second electrode layer via the contact hole Ct14, and the wiring is coupled to the source region of the semiconductor layer A11 via a contact hole.

As illustrated in FIG. 12A, the wiring 192 is coupled to the wiring 189 via the contact hole Ct15. Note that the wiring 192 is coupled to the gate node 173 via the contact holes Ct16 and Ct13, as described above. Note that the wiring 192 is an example of wiring formed by a predetermined electrode layer.

Electrically, it is sufficient that the wiring 192 be coupled between the contact holes Ct15 and Ct16. However, in the present embodiment, in plan view, the wiring 192 is further extended to the NOT circuit Inv2, and more specifically, to a position beyond the semiconductor layer A2n.

As illustrated in FIG. 12A, the wiring 193 is coupled to the wiring formed by the first electrode layer via the contact hole Ct17, and the wiring is coupled to the drain region of the semiconductor layer A2p and the drain region of the semiconductor layer A2n via contact holes, and is also coupled to the wiring 175 via a contact hole. Further, the wiring 193 is coupled to the wiring formed by the first electrode layer via the contact hole Ct18, and the wiring is coupled to the drain region of the semiconductor layer A21 via a contact hole. The wiring 193 is coupled to the output end of the NOT circuit Inv2 and the drain node of the transistor Sb21 in the transmission circuit 135. As illustrated in FIG. 12C, for example, the wiring 199 is formed extending in the Y direction, and the voltage LCcom is applied thereto.

A third interlayer insulating film 163 made of silicon oxide or the like is provided covering the second interlayer insulating film 162 and the wiring 191, 192, 193, and 199. After forming the third interlayer insulating film 163, the flat surface thereof may be flattened by CMP. A third electrode layer having transparency and conductive properties, such as ITO, is formed on the front surface of the third interlayer insulating film 163, and peripheral electrodes 119a and 119b are provided by patterning the third electrode layer.

Here, the thickness of the third interlayer insulating film 163, that is, the layer thickness from the upper end of the second electrode layer to the lower end of the third electrode layer is, for example, 0.3 to 0.5 μm. Accordingly, in the present embodiment, when the film thickness of the first interlayer insulating film 161 is d1, the film thickness of the second interlayer insulating film 162 is d2, and the film thickness of the third interlayer insulating film 163 is d3, a relationship therebetween is typically as follows.

$$d1 > d2 \geq d3$$

The peripheral electrodes 119a and 119b are used to functionally differentiate between the peripheral electrodes 119 described in FIG. 3. In more detail, as illustrated in FIG. 12C, the peripheral electrodes 119b are formed in island shapes with approximately the same shape and approximately the same pitch, in plan view, as the pixel electrodes 118 in the display region 10. The peripheral electrode 119b is in an electrically floating state, that is, is not electrically coupled to any other portion.

In contrast, island portions of the peripheral electrode 119a are coupled to each other by coupling portions W in the up-down and left-right directions, namely, in the X and Y directions in the drawings, and in the present embodiment, the voltage LCcom is applied thereto. In more detail, the peripheral electrode 119a is coupled to the wiring 199, to which the voltage LCcom is applied, via the contact hole Ct19 provided in the third interlayer insulating film 163.

When viewing the island-shaped portions of the peripheral electrodes 119a and 119b, the peripheral electrodes 119a and 119b are in the same row and in the same column as each other.

The peripheral electrodes 119b are provided in a region overlapping the wiring 181 and 182 in plan view. Note that the peripheral electrode 119a is an example of a first peripheral electrode formed from the same layer as the plurality of pixel electrodes 118, and has a shape in which the plurality of pixel electrodes 118 are coupled in the X direction and the Y direction.

On the other hand, in plan view, the wiring 192 has a portion extending along the NOT circuits Inv1 and Inv2 from the drain node of the transistor Sb11, and the extending portion of the wiring 192 from the contact hole Ct16 to the NOT circuit Inv2 is provided so as to overlap with the coupling portion of the peripheral electrode 119a in the X direction.

The third interlayer insulating film 163, which is sandwiched between the peripheral electrode 119a and the wiring 192, is an example of an interlayer insulating film.

The clock signal Clk is supplied to the wiring 181, which is coupled to the gate node of the transistor Sb11 in the odd numbered stage, and which is coupled to the gate node of the transistor Sb21 in the even numbered stage. In addition, the clock signal Clkx is supplied to the wiring 182, which is coupled to the gate node of the transistor Sb21 in the odd numbered stage, and which is coupled to the gate node of the transistor Sb11 in the even numbered stage. Thus, in the wiring 181 and 182, the parasitic capacitance is relatively large.

If, for example, a configuration is employed in which a constant voltage is applied to the peripheral electrode 119b, the capacitance is formed in a region facing the peripheral electrode 119b when seen from the wiring 181 and 182, and therefore, a large amount of parasitic capacitance is added to the wiring 181 and 182.

Thus, in this configuration, the waveform of the clock signals Clk and Clkx output from the display control circuit 200 becomes even more blunted by an amount corresponding to the amount of added capacitance, and in the transmission circuit 135, a malfunction at the timing at which the transistor Sb11 is turned off and the transistor Sb12 is turned on becomes more likely. Not only this, as a result of the change in the logic level of the clock signal Clk or Clkx, a charge-discharge to the parasitic capacitance causes power to be excessively consumed.

In the present embodiment, the peripheral electrode 119b, which overlaps in plan view with the wiring 181 to which the clock signal Clk is supplied and the wiring 182 to which the clock signal Clkx is supplied, is in the floating state, and thus the capacitance caused by the peripheral electrode 119b is not parasitic.

Therefore, according to the present embodiment, the malfunction of the transmission circuit 135 is suppressed not only by the capacitance element Ca added to the coupling point N11, but also by reducing a degree of blunting of the waveforms of the clock signals Clk and Clkx. Further, according to the present embodiment, since the capacitance caused by the peripheral electrode 119b is not parasitic in the wiring 181 and 182, the consumption of power caused by the charge-discharge to the capacitance is suppressed.

Note that the peripheral electrode 119b is an example of a second peripheral electrode that is in a floating state, and intersects, in plan view, with a signal line supplying a clock.

In the present embodiment, the capacitance element Ca is configured by sandwiching the third interlayer insulating film 163 between the peripheral electrode 119a and the wiring 192. The third interlayer insulating film 163 is independent of a structural change of the storage capacity 109. Therefore, even if the structure of the storage capacity 109 is changed, since the third interlayer insulating film 163 is easily made thinner, according to the present embodiment, a large capacity can be formed as the capacitance element Ca in a stable manner without any dependence on the structure of the storage capacity 109.

In the present embodiment, in plan view, of a region that is outside the display region 10 and in which the transmission circuit 135 is provided, the peripheral electrode 119b is provided in the region overlapping the wiring 181 and 182, and the peripheral electrode 119a is provided in a region not overlapping the wiring 181 and 182.

Figure 13:
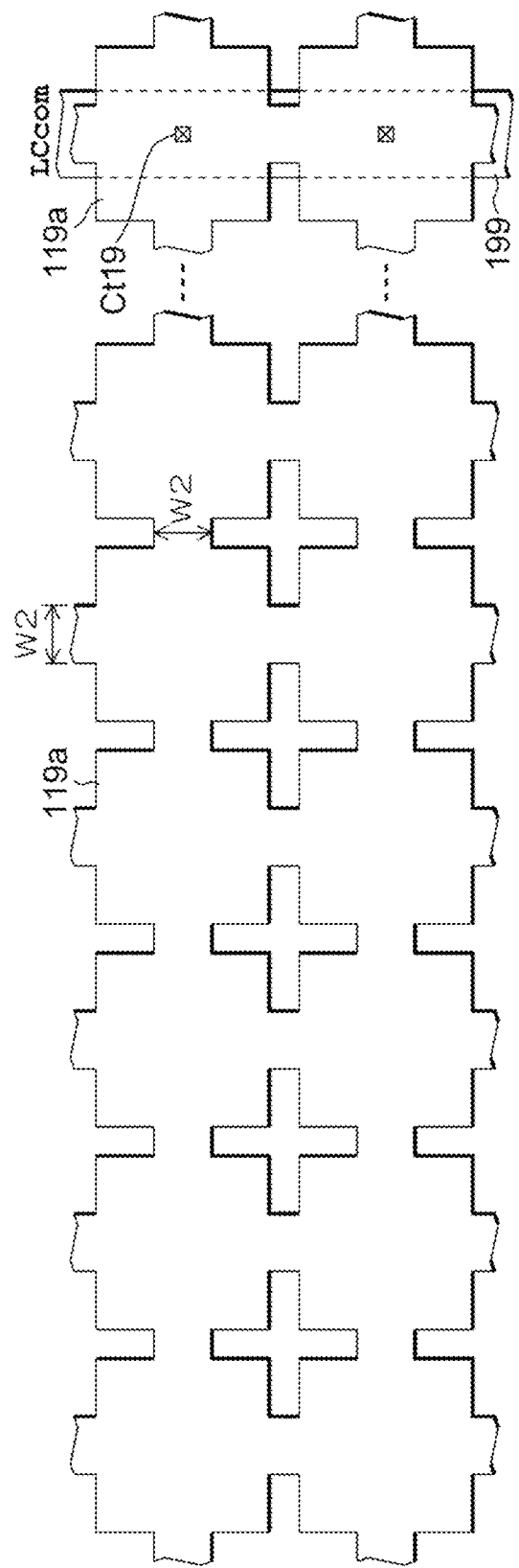
FIG. 13 is a diagram illustrating a configuration of the transmission circuit.

Further, in plan view, the peripheral electrode 119a is provided in a region that is outside the display region 10 and in which the transmission circuit 135 is not provided, as illustrated in FIG. 13.

The peripheral electrode 119a can also be a solid state shape, and not the shape in which the island-shaped portions are electrically coupled. However, in the present embodiment, the reason why the peripheral electrode 119a is not the solid state, and has the shape in which the island portions are coupled by the coupling portions W is as follows.

An oriented film is provided on the front surface of the pixel electrode 118 and the peripheral electrodes 119a and

119*b*. The oriented film defines the orientation of the liquid crystal molecules by rubbing, but in rubbing, debris is likely to occur. When the peripheral electrode 119*a* is the solid state, the front surface becomes flat and the debris moves more easily. As a result, debris generated outside the display region 10 enters the display region 10, and the display quality deteriorates.

Thus, in the present embodiment, for the peripheral electrode 119*a*, the island-shaped portions are coupled, and recesses and protrusions are left when viewed in cross section. Accordingly, in the present embodiment, firstly, debris is less likely to move due to the recesses and protrusions, and debris generated outside the display region 10 can be caught by the peripheral electrodes 119*a* and 119*b* to prevent the deterioration in display quality.

The pixel electrodes 118 and the peripheral electrodes 119*a* and 119*b* are formed by etching the third electrode layer formed of ITO or the like. If there are differences in coarseness and fineness in the pattern in the portion to be etched, the accuracy of etching is reduced in the patterning.

Thus, in the present embodiment, thirdly, without causing the peripheral electrode 119*a* to be the solid state, and by intentionally causing the peripheral electrode 119*a* to have a shape in which the portions to be etched are regularly provided, the pixel electrodes 118 and the peripheral electrodes 119*a* and 119*b* are patterned with good accuracy.

Next, a second embodiment will be described. The electro-optical device 100 according to the second embodiment differs from the first embodiment in the shape of the wiring 192 and the shape of the peripheral electrode 110*a* in the transmission circuit 135.

FIG. 14A to FIG. 14C are diagrams for describing a configuration of the transmission circuit 135 according to the second embodiment. In more detail, FIG. 14A is a diagram illustrating the configuration of the transmission circuit 135 in plan view, FIG. 14B is a diagram illustrating the configuration of the transmission circuit 135 when the transmission circuit 135 is cut along the line Aa-Ab in FIG. 14A, and FIG. 14C is a diagram illustrating, in plan view, the shape of the peripheral electrodes 119*a* and 119*b* in the transmission circuit 135.

Note that FIGS. 14A, 14B, and 14C have the same relationship as FIGS. 12A, 12B, and 12C.

In the first embodiment, as illustrated in FIG. 12A, the wiring 192 is formed so that a line width from the contact hole Ct15 to the contact hole C16 and a line width of a portion extending from the contact hole Ct16 to a position beyond the semiconductor layers A2*p* and A2*n* are approximately the same. Note that the line width of the wiring 192 refers to the length in the direction orthogonal to the extending direction.

In contrast, in the second embodiment, as illustrated in FIG. 14A, the wiring 192 is formed so that the line width of the portion extending from the contact hole Ct16 to the position beyond the semiconductor layers A2*p* and A2*n* is greater than the line width from the contact hole Ct15 to the contact hole C16.

In other words, in the second embodiment, of the wiring 192, when seen in FIG. 14A, the upper end side is a straight line, but the lower end side is bent twice at approximate right angles in the vicinity of the contact hole Ct16, and the line width widens.

Note that in the second embodiment, a region of the wiring 192 overlapping the peripheral electrode 119*a* is an example of a first portion, and a region of the wiring 192 overlapping the peripheral electrode 119*b* is an example of a second portion.

Further, in the first embodiment, as illustrated in FIG. 12C, widths of the coupling portions W of the island-shaped portions in the peripheral electrode 119*a* are substantially the same in the X direction and the Y direction.

In contrast, in the second embodiment, as illustrated in FIG. 14C, the widths of the coupling portions of the island-shaped portions in the peripheral electrode 119*a* differ between the X direction and the Y direction. In more detail, in the second embodiment, in the peripheral electrode 119*a*, a width W1*a* coupling the island-shaped portions over the X direction is wider than a width W2 coupling the island-shaped portions over the Y direction.

In the second embodiment, in plan view, as illustrated in FIG. 14C, an area over which the wiring 192 and the peripheral electrode 119*a* overlap is wider in comparison to the first embodiment illustrated in FIG. 12A. Therefore, according to the second embodiment, the capacity of the capacitance element Ca can be increased in comparison to the first embodiment.

Next, a third embodiment will be described. The electro-optical device 100 according to the third embodiment differs from the first and second embodiments in the shape of the peripheral electrode 119*a* in the transmission circuit 135.

FIG. 15A to FIG. 15C are diagrams illustrating a configuration of the transmission circuit 135. In more detail, FIG. 15A is a diagram illustrating the configuration of the transmission circuit 135 in plan view, FIG. 15B is a diagram illustrating the configuration of the transmission circuit 135 when the transmission circuit 135 is cut along the line Aa-Ab in FIG. 15A, and FIG. 15C is a diagram illustrating, in plan view, the shape of the peripheral electrodes 119*a* and 119*b* in the transmission circuit 135.

Note that FIGS. 15A, 15B, and 15C have the same relationship as FIGS. 14A, 14B, and 14C.

In the third embodiment, as illustrated in FIG. 15A, the wiring 192 is similar to that illustrated in FIG. 14A in the second embodiment, Further, in the third embodiment, as illustrated in FIG. 15C, in the peripheral electrode 119*a*, a width W1*b* coupling the island-shaped portions over the X direction is wider than the width W1*a* in the second embodiment.

In the third embodiment, when seen in plan view, as illustrated in FIG. 15C, the area over which the wiring 192 and the peripheral electrode 119*a* overlap is even wider in comparison to the second embodiment illustrated in FIG. 14A.

Therefore, according to the third embodiment, the capacity of the capacitance element Ca can be further increased in comparison to the second embodiment.

Figure 16A:
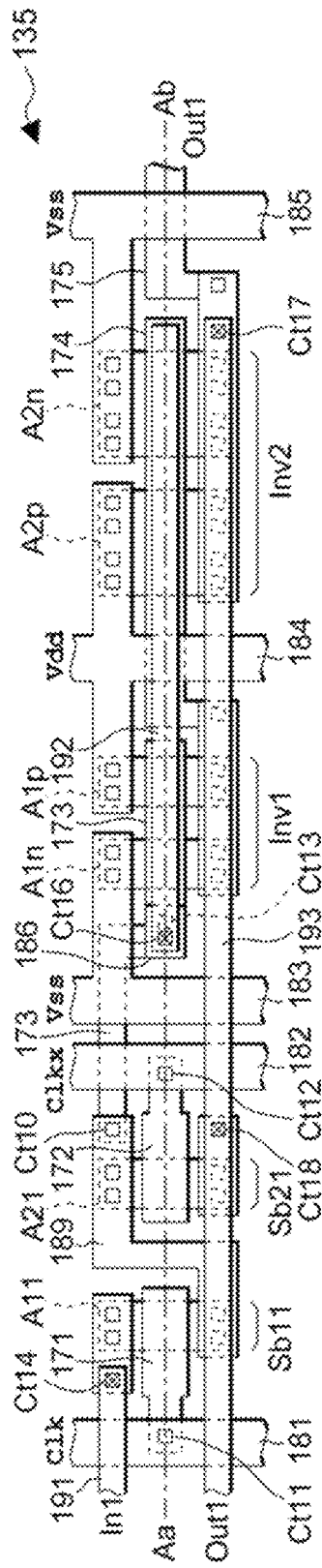

In the first to third embodiments (hereinafter referred to as the first embodiment and the like), the wiring 189 and the wiring 192 are coupled via the contact hole Ct15 and the configuration is obtained in which the wiring 182 and 183 formed by the first electrode layer overcross the wiring 192 formed by the second electrode layer. The configuration is not limited to such an example, and, for example, as illustrated in FIG. 16A, a configuration may be employed in which the gate node 173 formed by the gate electrode layer extends in the leftward direction in FIG. 16A. Note that in this configuration, the wiring line 189 is coupled to the gate node 173 via the contact hole Ct10, and the gate node 173 undercrosses the wiring 182 and 183.

Note that, in the configuration illustrated in FIG. 16A, the line width of the extending portion of the wiring 192 from the contact hole Ct16 to a position beyond the semiconductor layer A2*n* may be widened, as in the second embodiment.

Figure 16B:
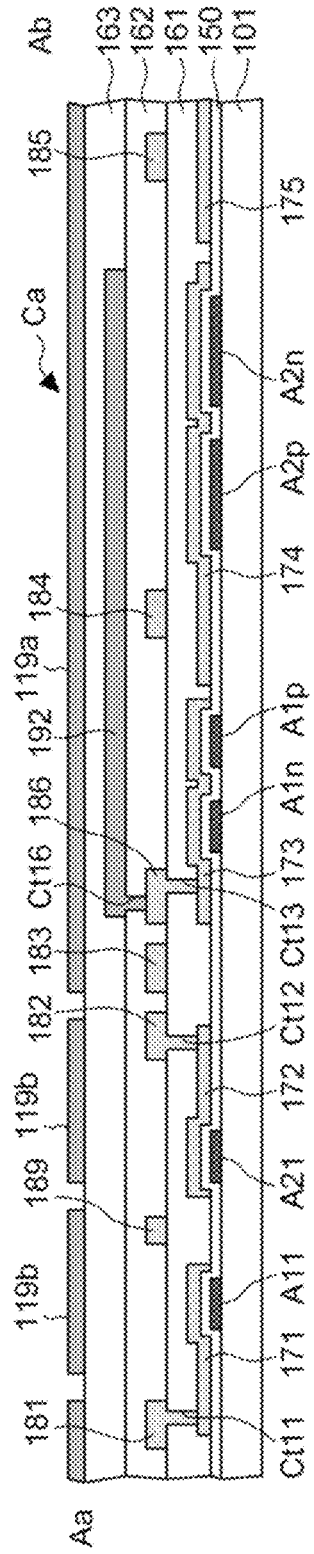

FIG. 16B is a diagram illustrating the configuration of the transmission circuit 135 when cut along the line Aa-Ab in FIG. 16A, but when cut along the line Aa-Ab, the difference with FIG. 12B is not apparent, and is a similar diagram to FIG. 12B.

Figure 16C:
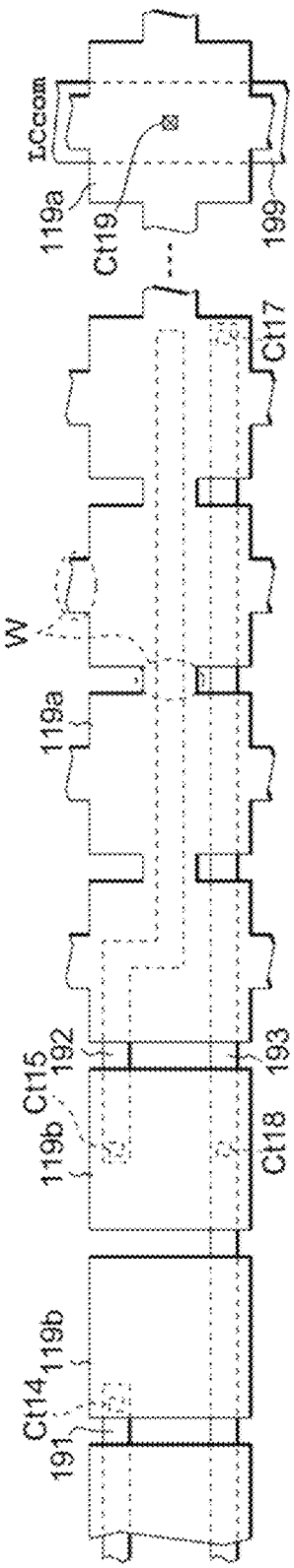

FIG. 16C is a diagram illustrating the wiring formed by patterning the second electrode layer and the wiring formed by patterning the third electrode layer, and is a similar diagram to FIG. 12C.

Further, in the first embodiment and the like, the transmission circuit 135 is the circuit illustrated in FIG. 6, but is also applicable to other circuits. Hence, a fourth embodiment in which the transmission circuit 135 has a separate configuration will be described.

Figure 17:
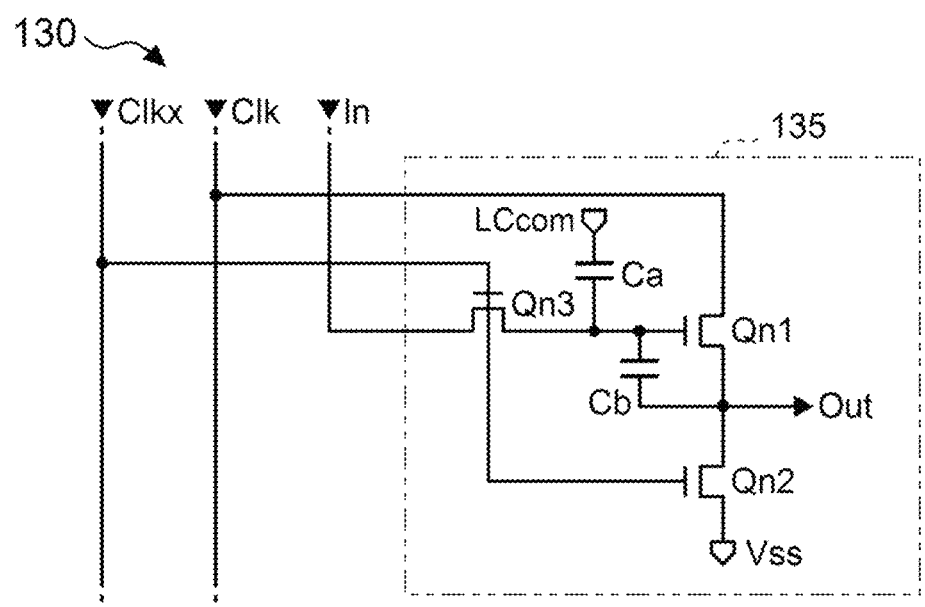
FIG. 17 is a circuit diagram of the transmission circuit of the electro-optical device according to a fourth embodiment.

FIG. 17 is a circuit diagram illustrating the first stage transmission circuit 135 in the electro-optical device 100 according to the fourth embodiment. Note that there are the odd numbered stages and the even numbered stages for the transmission circuit 135, but here the odd numbered stage is described as an example.

As illustrated in FIG. 17, the transmission circuit 135 includes transistors Qn1, Qn2, and Qn3, and capacitance elements Ca and Cb.

Note that the transistors Qn1, Qn2, and Qn3 are, for example, n-channel thin film transistors.

In the transistor Qn3, a source node is coupled to the input end In of the transmission circuit 135, and a drain node is coupled to one end of the capacitance element Ca, one end of the capacitance element Cb, and a gate node of the transistor Qn1. The voltage LCcom is applied to the other end of the capacitance element Ca, in a similar manner to the first embodiment and the like.

The clock signal Clk is supplied to the drain node of the transistor Qn1. The clock signal Clkx is supplied to a gate node of the transistor Qn3 and a gate node of the transistor Qn2.

The source node of the transistor Qn1, a drain node of the transistor Qn2, and the other end of the capacitance element Cb are coupled in common to form the output end Out of the transmission circuit 135.

Thus, the capacitance element Cb holds the voltage between the gate and source of the transistor Qn1. Note that, of the power supply voltages, the lower voltage Vss is applied to a source node of the transistor Qn2.

Note that, in the fourth embodiment, the transistor Qn3 is an example of a first transistor that captures a pulse supplied to the source node using the clock signal supplied to the gate node and performs output from the drain node.

Further, the transistor Qn1 is an example of a second transistor that inputs the pulse output from the drain node of the transistor Qn3.

Figure 18:
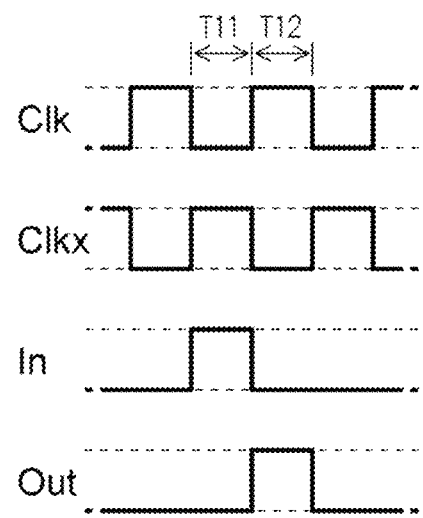
FIG. 18 is a diagram for describing an operation of the transmission circuit.

FIG. 18 is a diagram illustrating operations of the transmission circuit 135 according to the fourth embodiment.

At the input end In of the odd numbered stage transmission circuit 135, in a period T11, a pulse that is at the H level for the half-cycle of the clock signal Clk or Clkx is supplied from the output end of the previous stage transmission circuit 135, for example. The pulse is supplied in a period in which the clock signal Clk is at the L level and the clock signal Clkx is at the H level.

When the clock signal Clkx is at the H level, the transistors Qn2 and Qn3 are turned on. When the input end In is at the H level, the transistor Qn3 is turned on, and since the H level is applied to the gate node of the transistor Qn1, the transistor Qn1 is turned on. However, since the clock signal Clk is at the L level in the period T11 and, further, the transistor Qn2 is turned on, the output end Out is at the voltage Vss corresponding to the L level.

Note that in the period T11, the capacitance elements Ca and Cb hold the H level voltage of the pulse supplied to the input end In, with reference to the L level at the source node of the transistor Qn1.

In a period T12 following the period T11, the clock signal Clk is at the H level, the clock signal Clkx is at the L level, and the input end In is at the L level. The L level of the clock signal Clkx causes the transistors Qn2 and Qn3 to be turned off. On the other hand, in the capacitance elements Ca and Cb in the period T11, the voltage is charged that causes the transistor Q1n to be turned on. Thus, from the output end Out, the clock signal Clk at the H level is output as it is.

Note that in the odd numbered stage transmission circuit 135, in the period in which the clock signal Clk is at the L level and the clock signal Clkx is at the H level, if the input end In is at the L level, the voltage that causes the transistor Q1n to be turned off is charged to the capacitance elements Ca and Cb. Thus, even if the levels of the clock signals Clk and Clkx are inverted, the transistor Qn1 remains off. As a result, the output end Out is in a floating state, but the L level caused by the transistor Qn2 being turned on in the immediately preceding period in which the clock signal Clkx is at the H level is held at the parasitic capacitance in the output end Out.

Thus, because the transistor Qn2 is repeatedly turned on and off due to the repetition of the H and L levels in the clock signal Clkx, the floating state at the output end Out is not problematic.

Further, in the even numbered stage transmission circuit 135, the clock signals Clk and Clkx are supplied in a switched relationship to the odd numbered stage transmission circuit 135. Specifically, in the even numbered stage transmission circuit 135, the clock signal Clkx is supplied to the source node of the transistor Qn1, and the clock signal Clk is supplied to the gate node of the transistor Qn2 and the gate node of the transistor Qn3.

Thus, when a configuration is employed in which a state is repeated in which the output end Out of the transmission circuit 135 of a certain stage is coupled to the input end In of the transmission circuit 135 of the next stage, the pulses having a width of the half-cycle of the clock signal Clk or Clkx are output from the output end Out of the transmission circuit 135 in each of the stages, while being sequentially shifted by the half-cycle of the clock signal Clk or Clkx each time.

In the fourth embodiment, since the H level does not overlap between the signals output from the output end Out of the adjacent transmission circuits 135, unlike in the first embodiment and the like, when viewed as the scanning line drive circuit 130, there is no need to determine the logical product signal between the signals output from the adjacent transmission circuits 135.

In the fourth embodiment, the path selection circuit 137 in the first embodiment and the like may be added.

In the transmission circuit 135 according to the fourth embodiment, noise superimposition due to a parasitic capacitance component (not illustrated) on the output end Out may cause malfunction, but stable operation can be realized by the presence of the capacitor Ca. Accordingly, in the fourth embodiment, the capacitance Ca can be provided in a stable manner regardless of the structure of the storage capacitor 109 in the pixel circuit 110.

FIG. 19A to FIG. 19C are diagrams for describing the configuration of the transmission circuit 135 according to the fourth embodiment. Specifically, FIG. 19A is a diagram illustrating the configuration of the transmission circuit 135 according to the fourth embodiment in plan view, FIG. 19B is a diagram illustrating the configuration of the transmission circuit 135 when the transmission circuit 135 is cut at the line Aa-Ab in FIG. 19A, and FIG. 19C is a view illustrating, in plan view, the shape of the peripheral electrodes 119a and 119b in the transmission circuit 135.

FIGS. 19A, 19B, and 19C have the same relationship as FIGS. 12A,12B, and 12C of the first embodiment.

Note that in the fourth embodiment, in order to avoid repetition of the description of the first embodiment and the like, characteristic portions will be described mainly with reference to FIG. 19B.

As illustrated in FIG. 19B, semiconductor layers A33, A32, A41, and A31 are provided in that order from the left on the substrate 101.

The semiconductor layer A33 configures the transistor Qn3, and the semiconductor layer A32 configures the transistor Qn2. The semiconductor layer A41 is an electrode at the other end of the capacitance element Cb, and the semiconductor layer A31 configures the transistor Qn1.

The gate insulating film 150 is provided covering the substrate 101, and the semiconductor layers A33, A32, A41, and A31. After forming the gate electrode layer on the front surface of the gate insulating film 150, gate nodes 176 and 177 are provided by the patterning of the gate electrode layer.

Note that the gate node 177 serves both as the one end of the capacitance element Cb and the gate node for the transistor Qn3. The capacitance element Cb has a configuration in which the gate insulating film 150 is sandwiched between the semiconductor layer A41 and the gate node 177. Further, the semiconductor layer A41 functions as a conductor film by a high concentration of impurities being injected into the entire region. When the semiconductor layer A41 is formed as a conductor film in this manner, the capacitance element Cb functions as a capacitance element even when the gate node and the output Out of the transistor Qn1 are both at the same potential (for example, Vss). Specifically, in the fourth embodiment, the capacitance element Cb is described as having a layout in which the source and drain nodes of the transistor are coupled together. Here, when a transistor is formed in the same manner as the other transistors, when the gate node and the output Out are both at the same potential (Vss, for example), a voltage Vgs of the gate node is 0 V whatever the logic state of the clock signal Clk, and the transistor is not turned on, so the transistor does not function as a capacitance element. Thus, although having the form of the transistor, since a region under the gate electrode is also injected with a high concentration of impurities and is a constant conductor, the transistor can be caused to constantly function as the capacitance element.

A first interlayer insulating film 161 is provided covering the gate insulating film 150 and the gate nodes 176 and 177. A contact hole Ct21 is provided in the first interlayer insulating film 161 when the first interlayer insulating film 161 is cut along the line Aa-Ab.

The first electrode layer is formed on the front surface of the first interlayer insulating film 161, and the wiring 181, 182, and 183, and wiring 188a, 188b, 188c, and 188d are provided as illustrated in FIGS. 19A and 19B by the patterning of the first electrode layer.

In the fourth embodiment, as illustrated in FIG. 19A, the wiring 181 is coupled to a source region of the semiconductor layer A31, and the wiring 182 is coupled to the gate node 176 via the contact hole Ct21. Further, the wiring 183 is coupled to a source region of the semiconductor layer A32, and the wiring 188a is coupled to a drain region of the semiconductor layer A33. The wiring 188b is coupled to a drain region of the semiconductor layer A32, and the wiring 188c is coupled to the gate node 177. The wiring 188d is coupled to a drain region of the semiconductor layer A41 and a drain region of the semiconductor layer A31.

A second interlayer insulating film 162 is provided covering the first interlayer insulating film 161 and the wiring 181, 182, 183, 188a, 188b, 188c, and 188d.

The second electrode layer is formed on the front surface of the second interlayer insulating film 162, and wiring 194 and 195 are provided as illustrated in FIGS. 19A and 19B by the patterning of the second electrode layer.

The wiring 194 is coupled to the wiring 188a and 188c. Electrically, it is sufficient that the wiring 194 be coupled between the wiring 188a and the wiring 188c, but in the fourth embodiment, the wiring 194 is extended to a position beyond the semiconductor layer A31 in plan view.

The wiring 195 is coupled to the wiring 188b and 188d. Note that the wiring 195 is the output end Out of the transmission circuit 135.

A third interlayer insulating film 163 is provided covering the second interlayer insulating film 162, and the wiring 194 and 195. The third electrode layer is formed on the front surface of the third interlayer insulating film 163, and the peripheral electrodes 119a and 119b similar to those of the first embodiment are provided by the patterning of the third electrode layer.

In the fourth embodiment also, as illustrated in FIG. 19B or FIG. 19C, the capacitance element Ca has a configuration in which the third interlayer insulating film 163 is sandwiched by the wiring 194 formed by patterning the second electrode layer and the peripheral electrode 119a formed by patterning the third electrode layer.

Accordingly, in the fourth embodiment also, the capacitance element Ca can be formed in a stable manner regardless of the structure of the storage capacitor 109.

Note that in the fourth embodiment, the peripheral electrodes 119a and 119b have the same shape as those of the first embodiment, but may have the same shape as those of the second embodiment (see FIG. 14C). or those of the third embodiment (see FIG. 15C).

Next, an electronic apparatus to which the electro-optical device 100 according to the above-described embodiments is applied will be described.

Figure 20:
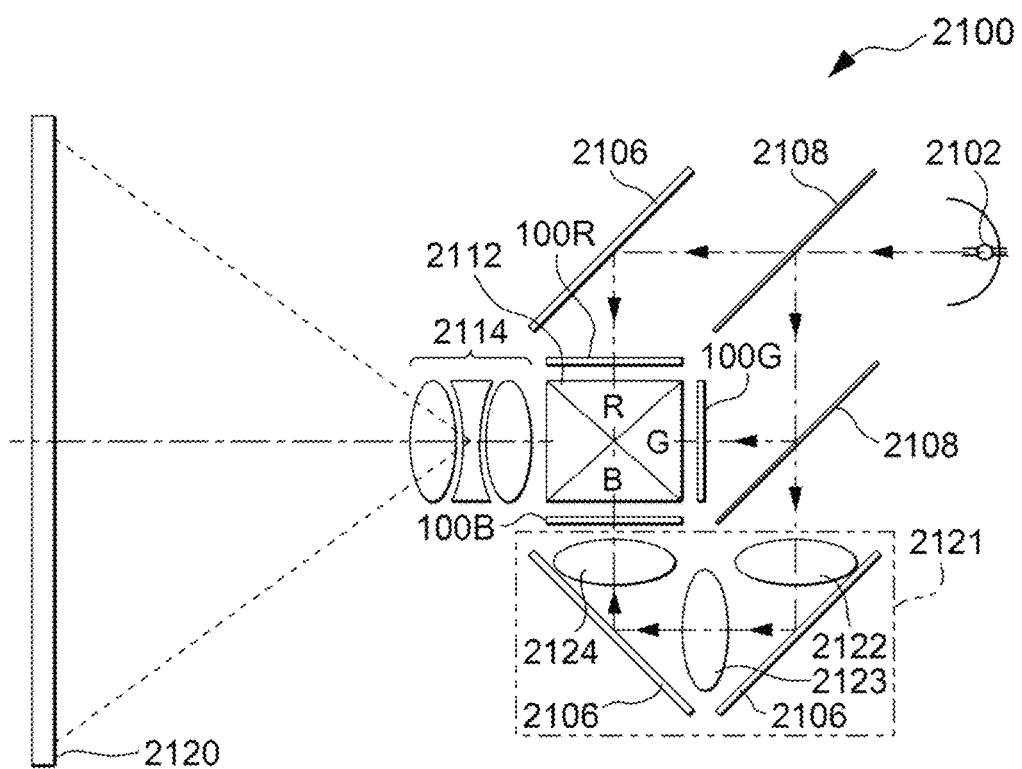

FIG. 20 is a diagram illustrating a configuration of a three-plate liquid crystal projector using the electro-optical device 100 described above as a light valve. As illustrated in FIG. 20, a liquid crystal projector 2100 is provided with electro-optical devices 100R, 100G, and 100B. The electro-optical devices 100R, 100G, and 100B are the same as the electro-optical device 100 according to the embodiments and the like, and respectively generate transmission images based on video data corresponding to the respective colors R, G, and B supplied by an upper circuit.

A lamp unit 2102 configured by a white light source, such as a halogen lamp, is provided inside the projector 2100. Projection light emitted from this lamp unit 2102 is split into three primary colors of red, green, and blue by three mirrors 2106 and two dichroic mirrors 2108 installed inside. Of the light of the primary colors, red light, green light, and blue light are incident on the electro-optical device 100R, the electro-optical device 100G, and the electro-optical device 100B, respectively.

Note that an optical path of the blue light is longer than that of the red and green light. Thus, the blue light is guided to the electro-optical device 100B via a relay lens system 2121 formed of an incidence lens 2122, a relay lens 2123, and an emission lens 2124 to prevent loss on the optical path.

The electro-optical device 100R supplies a red component data signal to the pixel circuit 110 by the scanning line drive circuit 130 and the data line drive circuit 140. In the electro-optical device 100R, when the data signal is supplied to each of the pixel circuits 110, the liquid crystal element 120 included in the pixel circuit 110 has a transmittance corresponding to the data signal. Thus, in the electro-optical device 100R, transmittance for the incident red light is controlled for each pixel, and thus, of an image to be displayed, a transmission image of the red component is generated.

Similarly, in the electro-optical devices 100G and 100B, a green component data signal and a blue component data signal are supplied to each of the pixel circuits 110, and, of each of the images to be displayed, transmission images of the green and blue components are respectively generated.

The transmission images of each of the colors respectively generated by the electro-optical devices 100R, 100G, and 100B are incident on the dichroic prism 2112 from three directions. Then, at this dichroic prism 2112, the light of R and the light of B are refracted at 90 degrees, whereas the light of G travels in a straight line. Accordingly, the images of the respective colors are synthesized, and subsequently a color image is projected onto a screen 2120 by a projection lens 2114.

Note that while each of the transmission images generated by the electro-optical devices 100R and 100B is projected after being reflected by the dichroic prism 2112, the transmission image generated by the electro-optical device 100G travels in a straight line and is projected. Thus, each of the transmission images generated by the electro-optical devices 100R and 100B has a left-right inverted relationship with respect to the transmission image generated by the electro-optical device 100G.

What is claimed is:

1. An electro-optical device comprising:
   a plurality of pixel electrodes arranged in a display region; and
   a drive circuit provided in a peripheral region outside the display region, wherein
   the drive circuit includes
   a first transistor configured to, based on a clock signal supplied to a gate node, output from a drain node a pulse supplied to a source node,
   a second transistor to which the pulse output from the drain node is supplied, and
   a capacitance element having one end coupled to the drain node and another end held at a predetermined potential,
   the capacitance element includes
   a first peripheral electrode formed of a same layer as the plurality of pixel electrodes,
   a wiring formed of a predetermined electrode layer, and
   an interlayer insulating film sandwiched between the first peripheral electrode and the wiring, and
   the wiring includes a portion overlapping the second transistor in plan view.

2. The electro-optical device according to claim 1, wherein
   the plurality of pixel electrodes are arranged in a first direction and a second direction,
   the first peripheral electrode includes island-shaped portions having a shape similar to that of the plurality of pixel electrodes and portions coupling the island-shaped portions in the first direction and the second direction, and
   the wiring includes a portion extending along the first direction from the drain node to the second transistor in plan view.

3. The electro-optical device according to claim 2, wherein the shape of the first peripheral electrode is formed such that a width of the portion coupling the island-shaped portions in the first direction is greater than a width of the portion coupling the island-shaped portions in the second direction.

4. The electro-optical device according to claim 1, comprising a second peripheral electrode formed of the same layer as the plurality of pixel electrodes, wherein
   the second peripheral electrode includes a portion intersecting, in plan view, a signal line supplying the clock signal, the second peripheral electrode being in an electrically floating state.

5. The electro-optical device according to claim 4, wherein
   the wiring includes a first portion of a region overlapping the first peripheral electrode in plan view, and a second portion in a portion of a region overlapping the second peripheral electrode, and
   a line width of the first portion is greater than a line width of the second portion.

6. An electronic apparatus comprising the electro-optical device according to claim 1.

* * * * *